US 12,108,169 B2

(12) United States Patent
Kim et al.

(10) Patent No.: US 12,108,169 B2
(45) Date of Patent: Oct. 1, 2024

(54) SPECTRAL FILTER, AND IMAGE SENSOR AND ELECTRONIC DEVICE INCLUDING THE SPECTRAL FILTER

(71) Applicant: SAMSUNG ELECTRONICS CO., LTD., Suwon-si (KR)

(72) Inventors: Hyochul Kim, Suwon-si (KR); Jaesoong Lee, Suwon-si (KR); Younggeun Roh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 92 days.

(21) Appl. No.: 18/094,044

(22) Filed: Jan. 6, 2023

(65) Prior Publication Data
US 2023/0217122 A1 Jul. 6, 2023

(30) Foreign Application Priority Data
Jan. 6, 2022 (KR) .................. 10-2022-0002351

(51) Int. Cl.
H04N 25/13 (2023.01)
G01J 3/26 (2006.01)
(Continued)

(52) U.S. Cl.
CPC ............. *H04N 25/13* (2023.01); *G02B 5/201* (2013.01); *G02B 5/26* (2013.01)

(58) Field of Classification Search
CPC ...... H04N 24/13; H04N 25/11; H04N 25/131; H04N 25/133; H04N 25/134;
(Continued)

(56) References Cited

U.S. PATENT DOCUMENTS 6,958,729 B1  10/2005 Metz
8,045,157 B2  10/2011 Shibayama et al.
(Continued)

FOREIGN PATENT DOCUMENTS

| CN | 110764249 A | 2/2020 |
| EP | 3 933 461 A2 | 1/2022 |
| WO | 2015/169761 A1 | 11/2015 |

OTHER PUBLICATIONS

Laurent Frey et al., "Multispectral interference filter arrays with compensation of angular dependence or extended spectral range", Optics Express, 2015, vol. 23, Issue 9, pp. 11799-11812, DOI: 10.1364/OE.23.011799.
(Continued)

*Primary Examiner* — Marly S Camargo
(74) *Attorney, Agent, or Firm* — Sughrue Mion, PLLC

(57) ABSTRACT

A spectral filter may include a plurality of filter arrays each including a plurality of unit filters having different center wavelengths from each other. Each of the plurality of unit filters may include a first metal reflection layer and a second metal reflection layer which are disposed to be apart from each other; a cavity including a first pattern and being arranged between the first metal reflection layer and the second metal reflection layer; and a lower pattern film being disposed under the first metal reflection layer and including a second pattern. In unit filters having a same center wavelength in each of the plurality of unit filters corresponding to the plurality of filter arrays, the first pattern of the cavity and the second pattern of the lower pattern film may vary according to a position of the unit filters.

20 Claims, 28 Drawing Sheets

(51) Int. Cl.
  *G02B 5/20* (2006.01)
  *G02B 5/26* (2006.01)
  *G02B 5/28* (2006.01)
  *H01L 27/146* (2006.01)
  *H04N 25/11* (2023.01)

(58) Field of Classification Search
  CPC .......... H04N 25/135; G02B 5/26; G02B 5/28; G02N 5/201; G02N 5/284; H01L 27/14621; H01J 3/26
  See application file for complete search history.

(56) References Cited

U.S. PATENT DOCUMENTS

| | | | |
|---|---|---|---|
| 10,170,509 B2 | 1/2019 | Ockenfuss | |
| 10,651,220 B2 | 5/2020 | Huang et al. | |
| 11,175,182 B2* | 11/2021 | Kim | ........................... G01J 3/28 |
| 11,818,343 B2* | 11/2023 | Kim | ........................ G02B 5/285 |
| 2014/0061486 A1 | 3/2014 | Bao et al. | |
| 2017/0059754 A1 | 3/2017 | Frey et al. | |
| 2018/0045953 A1 | 2/2018 | Fan et al. | |
| 2019/0016091 A1 | 1/2019 | Lee et al. | |
| 2019/0049296 A1 | 2/2019 | Cho et al. | |
| 2019/0086259 A1 | 3/2019 | Cho | |
| 2019/0244993 A1 | 8/2019 | Yamaguchi et al. | |
| 2019/0277693 A1 | 9/2019 | Kim et al. | |
| 2020/0194474 A1 | 6/2020 | Meynants | |
| 2020/0314983 A1 | 10/2020 | Park et al. | |
| 2020/0403023 A1 | 12/2020 | Huang et al. | |
| 2021/0127101 A1 | 4/2021 | Roh et al. | |
| 2021/0372853 A1 | 12/2021 | Borremans et al. | |
| 2022/0003906 A1 | 1/2022 | Kim et al. | |
| 2022/0028909 A1* | 1/2022 | Kim | ...................... H04N 25/131 |
| 2022/0342129 A1 | 10/2022 | Lee et al. | |
| 2022/0342130 A1* | 10/2022 | Kim | ...................... H04N 25/131 |
| 2023/0093853 A1 | 3/2023 | Kim et al. | |
| 2023/0217122 A1 | 7/2023 | Kim et al. | |
| 2023/0280210 A1* | 9/2023 | Borremans | ............ G01J 3/2803 |
| 2023/0349758 A1* | 11/2023 | Kim | ........................ G02B 5/288 |
| 2024/0027663 A1* | 1/2024 | Jung | ................. H01L 27/14621 |

OTHER PUBLICATIONS

The Extended European Search Report issued on Jun. 5, 2023 by the European Patent Office for European Patent Application No. 22215532.7.

* cited by examiner (a)

(b)

(c)

(d)

(e)

SPECTRAL FILTER, AND IMAGE SENSOR AND ELECTRONIC DEVICE INCLUDING THE SPECTRAL FILTER

CROSS-REFERENCE TO RELATED APPLICATIONS

This application is based on and claims priority under 35 U.S.C. § 119 to Korean Patent Application No. 10-2022-0002351, filed on Jan. 6, 2022, in the Korean Intellectual Property Office, the disclosure of which is incorporated by reference herein in its entirety.

BACKGROUND

1. Field

The disclosure relates to a spectral filter, and an image sensor and an electronic device each including the spectral filter.

2. Description of the Related Art

Traditionally, image sensors classify wavelength bands into three sections (i.e., red (R), green (G), and blue (B)); however, these traditional sensors have limitations with regard to color expression accuracy and object recognition performance. Existing spectral filters that divide wavelength bands into more sections have been used for special-purpose cameras which include bulky and complex optical element parts.

SUMMARY

Provided are a spectral filter, and an image sensor and an electronic device each including the spectral filter.

Additional aspects will be set forth in part in the description which follows and, in part, will be apparent from the description, or may be learned by practice of the presented embodiments of the disclosure.

A spectral filter may include a plurality of filter arrays each including a plurality of unit filters having different center wavelengths from each other. Each of the plurality of unit filters may include a first metal reflection layer and a second metal reflection layer which are disposed to be apart from each other; a cavity including a first pattern and being arranged between the first metal reflection layer and the second metal reflection layer; and a lower pattern film being disposed under the first metal reflection layer and including a second pattern. In unit filters having a same center wavelength in each of the plurality of unit filters corresponding to the plurality of filter arrays, the first pattern of the cavity and the second pattern of the lower pattern film may vary according to a position of the unit filters having the same center wavelength to compensate for a center wavelength shift caused by a change in a chief ray angle of incident light.

An effective refractive index of the cavity and the lower pattern film may vary with a size of the first pattern and the second pattern.

The cavities of each of the plurality of unit filters may be of uniform thickness and the lower pattern films of each of the plurality of unit filters may be of uniform thickness.

The cavity may include a first dielectric and a plurality of second dielectrics, the plurality of second dielectrics having a different refractive index than the first dielectric and forming the first pattern.

The lower pattern film may include a third dielectric and a plurality of fourth dielectrics, the plurality of fourth dielectrics having a different refractive index than the third dielectric and forming the second pattern.

Each of the first metal reflection layer and the second metal reflection layer may include at least one of Al, Ag, Au, Cu, W, Ti, or TiN.

Each of the unit filters may further include an upper pattern film being disposed on the second metal reflection layer and including a third pattern.

In the unit filters having the same center wavelength, the third pattern of the upper pattern film may vary according to a position of the unit filters having the same center wavelength.

The upper pattern film may include a fifth dielectric and a plurality of sixth dielectrics, the plurality of sixth dielectrics having a different refractive index than the fifth dielectric and forming the third pattern.

Each of the plurality of unit filters further may include a color filter disposed on the second metal reflection layer and being configured to transmit only a particular wavelength band.

A spectral filter may include a plurality of filter arrays each including a plurality of unit filters having different center wavelengths from each other. Each of the plurality of unit filters may include: a first Bragg reflection layer and a second Bragg reflection layer which are disposed to be apart from each other; and a cavity including a pattern and being arranged between the first Bragg reflection layer and the second Bragg reflection layer. In unit filters having a same center wavelength in each of the plurality of unit filters corresponding to the plurality of filter arrays, the pattern of the cavity may vary according to a position of the unit filters having the same center wavelength to compensate for a center wavelength shift caused due to different positions of the unit filters having the same center wavelength.

The cavity may include a first dielectric and a plurality of second dielectrics, the plurality of second dielectrics having a different refractive index than the first dielectric and forming the pattern.

Each of the plurality of unit filters further may include a color filter disposed on the second Bragg reflection layer and being configured to transmit only a particular wavelength band.

A spectral filter may include a plurality of filter arrays each including a plurality of unit filters having different center wavelengths from each other. Each of the plurality of unit filters may include: a first reflection layer and a second reflection layer which are disposed to be apart from each other; and a cavity being arranged between the first reflection layer and the second reflection layer and including a first pattern. Unit filters having a same center wavelength in some of the plurality of unit filters may include a wavelength shift compensation layer configured to compensate for a center wavelength shift caused due to different positions of the unit filters having the same center wavelength.

The wavelength shift compensation layer may have different thicknesses according to a position of the unit filters having the same center wavelength.

The wavelength shift compensation layer may include a pattern that varies according to a position of the unit filters having the same center wavelength.

The first reflection layer and the second reflection layer respectively may include a first metal reflection layer and a second metal reflection layer.

A lower pattern film including a second pattern may be disposed under the first metal reflection layer.

The lower pattern film may further include a lower wavelength shift compensation layer.

An upper pattern film including a third pattern may be disposed on the second metal reflection layer.

The upper pattern film may further include an upper wavelength shift compensation layer.

Each of the plurality of unit filters may further include a color filter disposed on the second reflection layer and being configured to transmit only a particular wavelength band.

An image sensor may include: a pixel array including a plurality of pixels; and a spectral filter disposed at the pixel array. The spectral filter may include a plurality of filter arrays each including a plurality of unit filters having different center wavelengths from each other. Each of the plurality of unit filters may include: a first metal reflection layer and a second metal reflection layer which are disposed to be apart from each other; a cavity including a first pattern and being arranged between the first metal reflection layer and the second metal reflection layer; and a lower pattern film being disposed under the first metal reflection layer and including a second pattern. In unit filters having a same center wavelength in each of the plurality of unit filters corresponding to the plurality of filter arrays, the first pattern of the cavity and the second pattern of the lower pattern film may vary according to a position of the unit filters having the same center wavelength to compensate for a center wavelength shift caused due to different positions of the unit filters having the same center wavelength.

Each of the unit filters may further include an upper pattern film being disposed on the second metal reflection layer and including a third pattern.

In the unit filters having the same center wavelength, the third pattern of the upper pattern film may vary according to a position of the unit filters having the same center wavelength.

Each of the plurality of unit filters may further include a color filter disposed on the second metal reflection layer and being configured to transmit only a particular wavelength band.

The image sensor may further include a timing controller, a row decoder, and an output circuit.

An electronic device may include an image sensor including: a pixel array including a plurality of pixels; and a spectral filter disposed at the pixel array. The spectral filter may include a plurality of filter arrays each including a plurality of unit filters having different center wavelengths from each other. Each of the plurality of unit filters may include: a first metal reflection layer and a second metal reflection layer which are disposed to be apart from each other; a cavity including a first pattern and being arranged between the first metal reflection layer and the second metal reflection layer; and a lower pattern film being disposed under the first metal reflection layer and including a second pattern. In unit filters having a same center wavelength in each of the plurality of unit filters corresponding to the plurality of filter arrays, the first pattern of the cavity and the second pattern of the lower pattern film may vary according to a position of the unit filters having the same center wavelength to compensate for a center wavelength shift caused due to different positions of the unit filters having the same center wavelength.

The electronic device may include a mobile phone, a smartphone, a tablet, a smart tablet, a digital camera, a camcorder, a notebook computer, a television, a smart television, a smart refrigerator, a security camera, a robot, or a medical camera.

An image sensor may include: a pixel array including a plurality of pixels; and a spectral filter disposed at the pixel array. The spectral filter may include a plurality of filter arrays each including a plurality of unit filters having different center wavelengths from each other. Each of the plurality of unit filters may include: a first Bragg reflection layer and a second Bragg reflection layer which are disposed to be apart from each other; and a cavity including a pattern and being arranged between the first Bragg reflection layer and the second Bragg reflection layer. In unit filters having a same center wavelength in each of the plurality of unit filters corresponding to the plurality of filter arrays, the pattern of the cavity may vary according to a position of the unit filters having the same center wavelength to compensate for a center wavelength shift caused due to different positions of the unit filters having the same center wavelength.

Each of the plurality of unit filters may further include a color filter disposed on the second Bragg reflection layer and being configured to transmit only a particular wavelength band.

The image sensor may further include a timing controller, a row decoder, and an output circuit.

An electronic device may include an image sensor including: a pixel array including a plurality of pixels; and a spectral filter disposed at the pixel array. The spectral filter may include a plurality of filter arrays each including a plurality of unit filters having different center wavelengths from each other. Each of the plurality of unit filters may include: a first Bragg reflection layer and a second Bragg reflection layer which are disposed to be apart from each other; and a cavity including a pattern and being arranged between the first Bragg reflection layer and the second Bragg reflection layer. In unit filters having a same center wavelength in each of the plurality of unit filters corresponding to the plurality of filter arrays, the pattern of the cavity may vary according to a position of the unit filters having the same center wavelength to compensate for a center wavelength shift caused due to different positions of the unit filters having the same center wavelength.

An image sensor may include: a pixel array including a plurality of pixels; and a spectral filter disposed at the pixel array. The spectral filter may include a plurality of filter arrays each including a plurality of unit filters having different center wavelengths from each other. Each of the plurality of unit filters may include: a first reflection layer and a second reflection layer which are disposed to be apart from each other; and a cavity being arranged between the first reflection layer and the second reflection layer and including a first pattern. Unit filters having a same center wavelength in some of the plurality of unit filters may include a wavelength shift compensation layer configured to compensate for a center wavelength shift caused due to different positions of the unit filters having a same center wavelength.

The wavelength shift compensation layer may have different thicknesses according to a position of the unit filters having the same center wavelength.

The wavelength shift compensation layer may include a pattern that varies according to a position of the unit filters having the same center wavelength.

The first reflection layer and the second reflection layer respectively may include a first metal reflection layer and a second metal reflection layer.

A lower pattern film including a second pattern may be disposed under the first metal reflection layer.

The lower pattern film may further include a lower wavelength shift compensation layer.

An upper pattern film including a third pattern may be disposed on the second metal reflection layer.

The upper pattern film may further include an upper wavelength shift compensation layer.

Each of the plurality of unit filters may further include a color filter disposed on the second reflection layer and being configured to transmit only a particular wavelength band.

The image sensor may further include a timing controller, a row decoder, and an output circuit.

An electronic device may include an image sensor comprising: a pixel array including a plurality of pixels; and a spectral filter disposed at the pixel array. The spectral filter may include a plurality of filter arrays each including a plurality of unit filters having different center wavelengths from each other. Each of the plurality of unit filters may include: a first reflection layer and a second reflection layer which are disposed to be apart from each other; and a cavity being arranged between the first reflection layer and the second reflection layer and including a first pattern. Unit filters having a same center wavelength in some of the plurality of unit filters may include a wavelength shift compensation layer configured to compensate for a center wavelength shift caused due to different positions of the unit filters having a same center wavelength.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
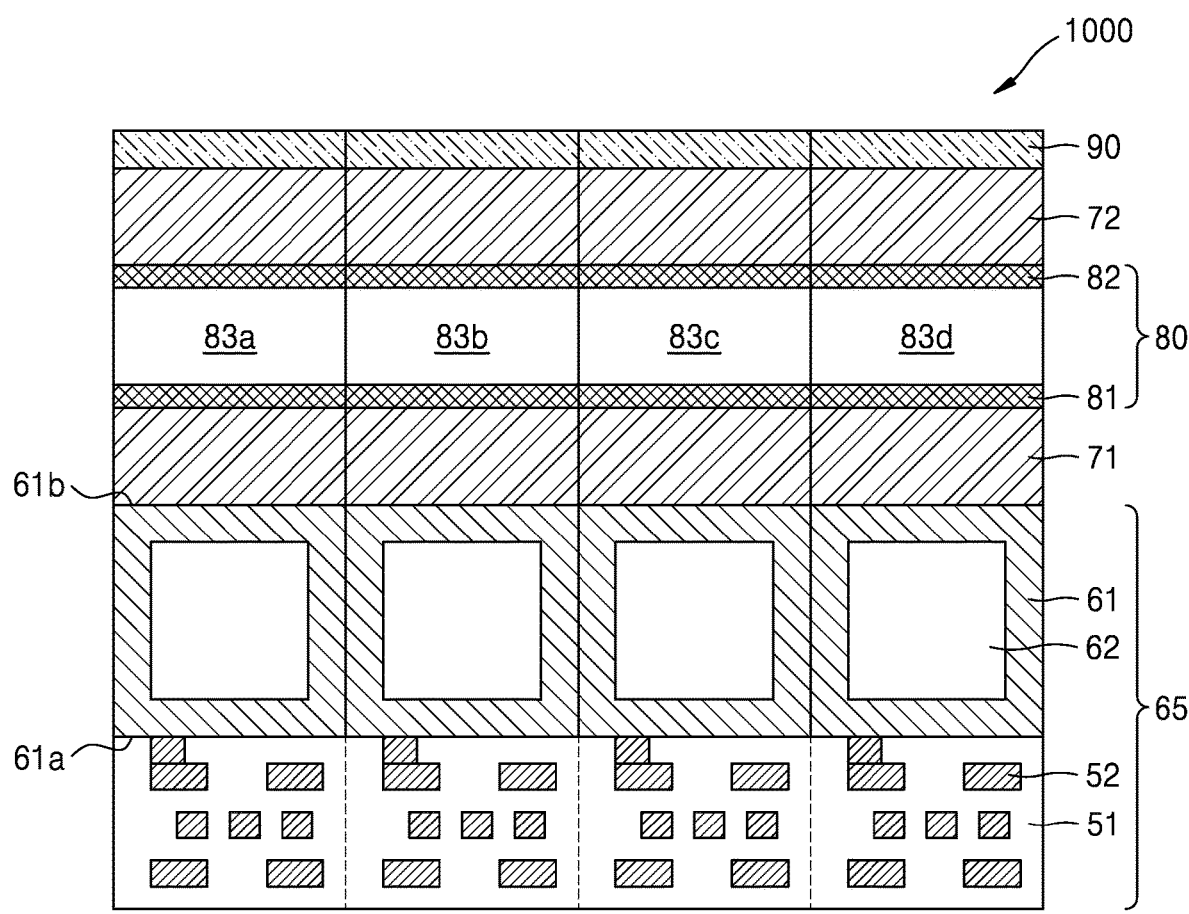
FIG. 1 is a schematic diagram of a cross-section of an image sensor according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described in detail with reference to the accompanying drawings. In the drawings, like reference numerals in the drawings denote like elements, and sizes of components in the drawings may be exaggerated for clarity and convenience of explanation. Meanwhile, embodiments described below are provided only as an example, and thus can be embodied in various forms.

It will be understood that when a component is referred to as being "on" or "over" another component, the component can be directly on, under, on the left of, or on the right of the other component, or can be on, under, on the left of, or on the right of the other component in a non-contact manner. An expression used in the singular encompasses the expression of the plural, unless it has a clearly different meaning in the context. When a portion "includes" an element, another element may be further included, rather than excluding the existence of the other element, unless otherwise described.

The use of the terms "a" and "an" and "the" and similar referents in the context of describing embodiments (especially in the context of the following claims) are to be construed to cover both the singular and the plural. The operations of all methods described herein can be performed in any suitable order unless otherwise indicated herein or otherwise clearly contradicted by context, and embodiments are not limited to the described order of the operations.

Moreover, the terms "part," "module," etc. refer to a unit processing at least one function or operation, and may be implemented by a hardware, a software, or a combination thereof.

The connecting lines, or connectors shown in the various figures presented are intended to represent exemplary functional relationships and/or physical or logical couplings between the various elements, and thus it should be noted that many alternative or additional functional relationships, physical connections or logical connections may be present in a practical device.

The use of any and all examples, or exemplary language provided herein, is intended merely to better illuminate technical ideas and does not pose a limitation on the scope of embodiments unless otherwise claimed.

FIG. 1 is a schematic diagram of a cross-section of an image sensor 1000 according to an example embodiment. The image sensor 1000 of FIG. 1 may include, for example, a complementary metal oxide semiconductor (CMOS) image sensor or a charge-coupled device (CCD) image sensor.

With reference to FIG. 1, the image sensor 1000 may include a pixel array 65 and a resonator structure 80 arranged on the pixel array 65. The pixel array 65 may include a plurality of pixels arranged in a two-dimensional (2D) manner, and the resonator structure 80 may include a plurality of resonators arranged in correspondence with the plurality of pixels. For example, FIG. 1 illustrates a case where the pixel array 65 includes four pixels, and the resonator structure 80 includes four resonators.

Each pixel of the pixel array 65 may include a photodiode 62, which is a photoelectric transformation element, and a driver circuit 52 to drive the photodiode 62. The photodiode 62 may be buried in a semiconductor substrate 61. The semiconductor substrate 61 may be, for example, a silicon substrate. However, the embodiments are not limited thereto. A wiring layer 51 may be arranged on a lower surface 61a of the semiconductor substrate 61, and the driver circuit 52, such as a metal oxide silicon field effect transistor (MOSFET) may be arranged in the wiring layer 51.

The resonator structure 80 including a plurality of resonators may be arranged above the semiconductor substrate 61. Each resonator may be arranged to transmit light of a particular desired wavelength region. Each resonator may include a first reflection layer 81 and a second reflection layer 82, which are spaced apart from each other, and cavities 83a, 83b, 83c, and 83d arranged between the first reflection layer 81 and the second reflection layer 82. Each of the first reflection layer 81 and the second reflection layer 82 may include, for example, a metal reflection layer or a Bragg reflection layer. Each of the cavities 83a, 83b, 83c, and 83d may be arranged to cause resonance of light of a particular desired wavelength region.

A first functional layer 71 may be arranged between an upper surface 61b of the semiconductor substrate 61 and the resonator structure 80. The first functional layer 71 may improve a transmittance of light passing through the resonator structure 80 and incident towards the photodiode 62. To this end, the first functional layer 71 may include a dielectric layer or a dielectric pattern with adjusted refractive index.

A second functional layer 72 may be arranged on an upper surface of the resonator structure 80. The second functional layer 72 may improve a transmittance of light incident towards the resonator structure 80. To this end, the second functional layer 72 may include a dielectric layer or a dielectric pattern with adjusted refractive index. A third functional layer 90 may be further arranged on an upper surface of the second functional layer 72. The third functional layer 90 may include, for example, an anti-reflection layer, a condenser lens, a color filter, a short-wavelength absorption filter, a long-wavelength cut-off filter, etc. However, this is only an example.

At least one of the first to third functional layers 71, 72, and 90 may constitute a spectral filter described below together with the resonator structure 80. Hereinafter, a spectral filter according to an example embodiment is described in detail.

Figure 2:
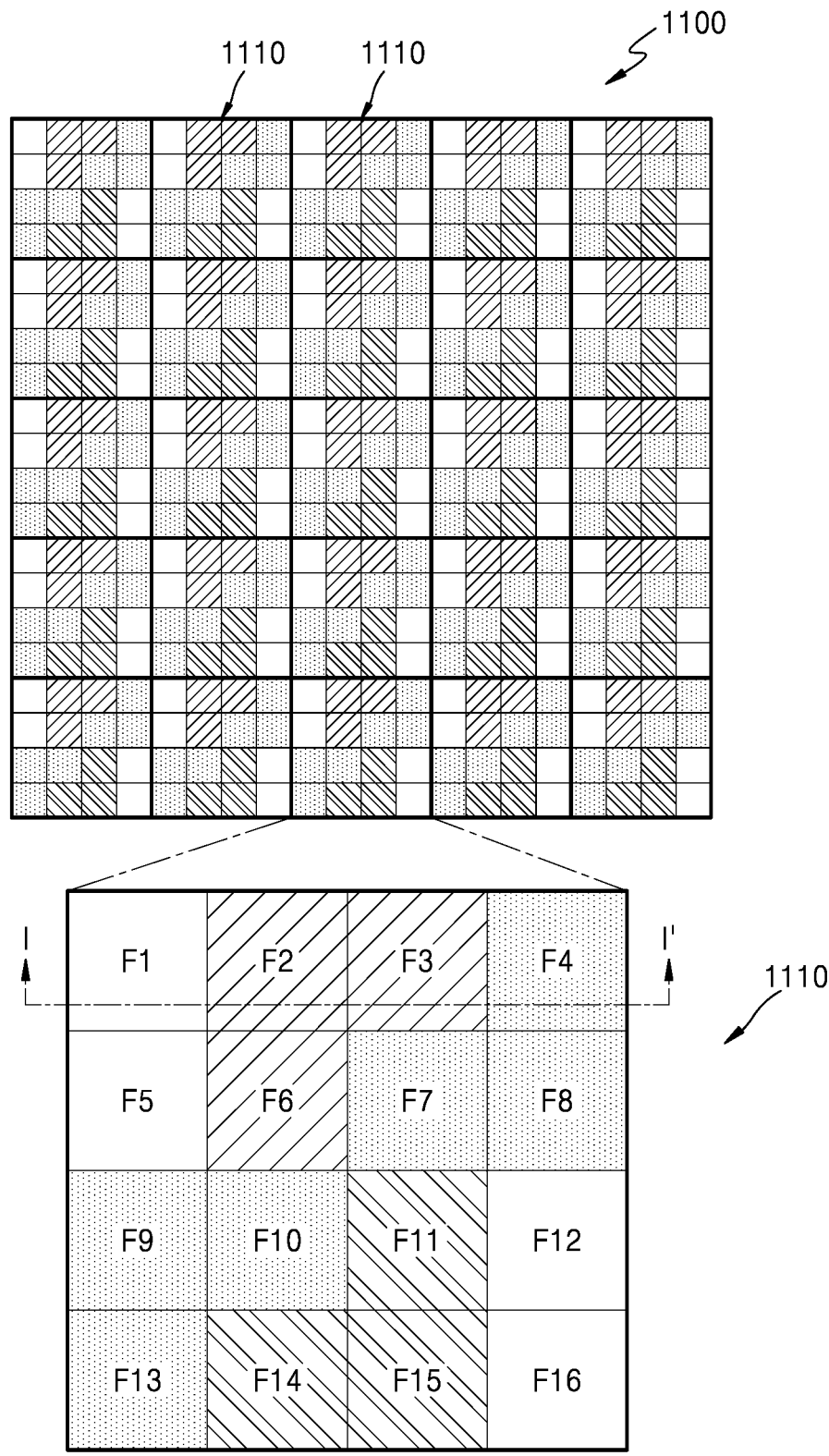
FIG. 2 is a plan view of a spectral filter according to an embodiment.

FIG. 2 is a plan view of an example of a spectral filter 1100 according to an embodiment.

With reference to FIG. 2, the spectral filter 1100 may include a plurality of filter arrays 1110 arranged in a 2D manner. FIG. 2 illustrates an example of 25 filter arrays arranged in a 5×5 array. Each of the filter arrays 1110 may include, for example, 16 unit filters F1 to F16 having different center wavelengths from each other and arranged in a 4×4 array.

Figure 3:
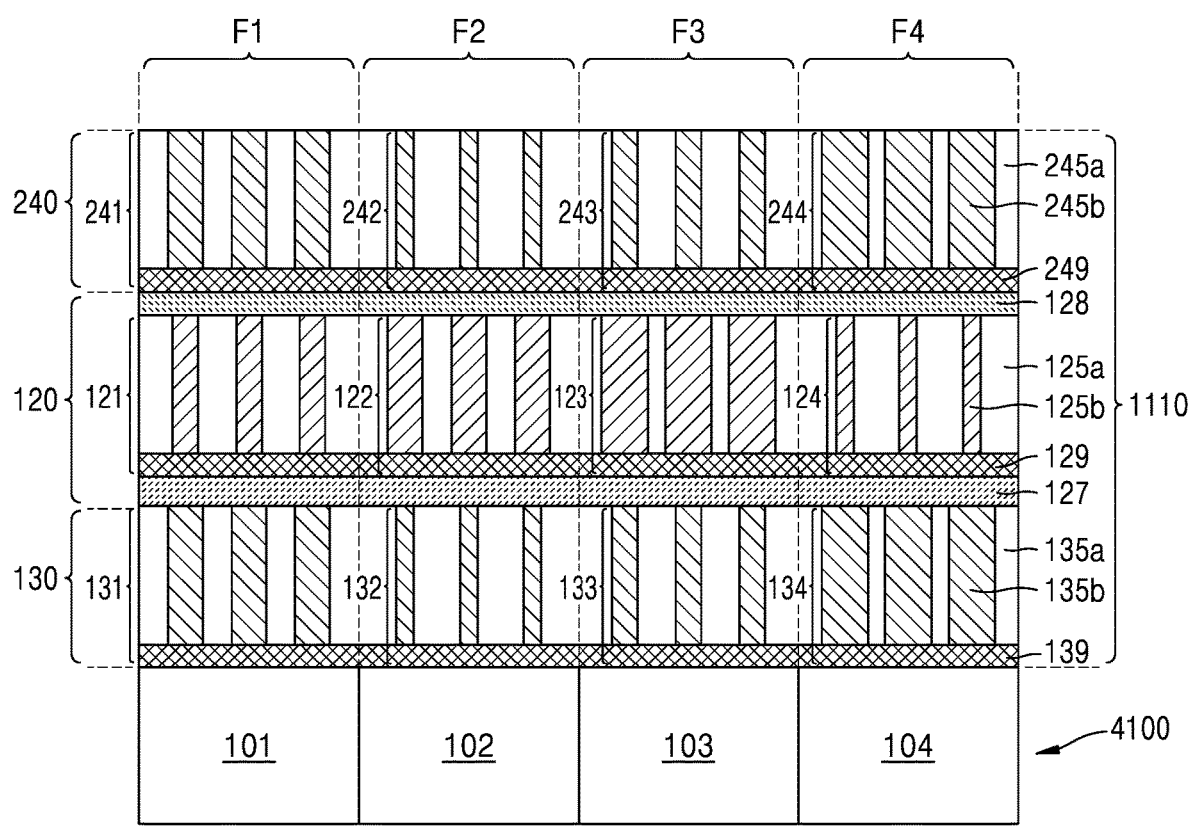
FIG. 3 is a cross-sectional view taken along the line I-I' to illustrate a filter array in the spectral filter of FIG. 2 according to an embodiment.

FIG. 3 is a cross-sectional view taken along the line I-I' to illustrate a filter array in the spectral filter of FIG. 2 according to an embodiment.

With reference to FIGS. 2 and 3, the spectral filter 1100 may include a plurality of unit filters (i.e., a first unit filter F1, a second unit filter F2, a third unit filter F3, and a fourth unit filter F4) arranged in a 2D manner. A pixel array 4100 including a plurality of pixels (i.e., a first pixel 101, a second pixel 102, a third pixel 103, and a fourth pixel 104) respectively corresponding to the plurality unit F1 to F4 may be provided under the spectral filter 1100. FIG. 3 illustrates an example of the first to fourth unit filters F1, F2, F3, and F4 and the first to fourth pixels 101, 102, 103, and 104. The first to fourth unit filters F1, F2, F3, and F4 may have different center wavelengths from each other.

The spectral filter 1100 may include a resonance layer 120 including a plurality of resonators. The resonance layer 120 may include a first metal reflection layer 127 and a second metal reflection layer 128 which are apart from each other and a plurality of cavities (i.e., a first cavity 121, a second cavity 122, a third cavity 123, and a fourth cavity 124) arranged between the first and second metal reflection layers 127 and 128. The first and second metal reflection layers 127 and 128 may be a lower metal reflection layer and an upper metal reflection layer, respectively. FIG. 3 illustrates an example of four resonators (i.e., a first resonator, a second resonator, a third resonator, and a fourth resonator) and the first to fourth cavities 121, 122, 123, and 124.

The first resonator may include the first and second metal reflection layers 127 and 128, and the first cavity 121 arranged between the first and second metal reflection layers 127 and 128, and the second resonator may include the first and second metal reflection layers 127 and 128, and the second cavity 122 may be arranged between the first and second metal reflection layers 127 and 128. The third resonator may include the first and second metal reflection layers 127 and 128, and the third cavity 123 may be arranged between the first and second metal reflection layers 127 and 128, and the fourth resonator may include the first and second metal reflection layers 127 and 128, and the fourth cavity 124 may be arranged between the first and second metal reflection layers 127 and 128. The first to fourth resonators may have different center wavelengths from each other.

Each resonator may have a Fabry-Perot structure. When light passes through the second metal reflection layer 128 and is incident on each of the first to fourth cavities 121, 122, 123, and 124, the light may reciprocate in the first to fourth cavities 121, 122, 123, and 124 between the first and second metal reflection layers 127 and 128 during which a constructive interference and a destructive interference may occur. In each of the first to fourth cavities 121, 122, 123, and 124, the light having particular center wavelengths and satisfying constructive interference conditions may pass through the first metal reflection layer 127 and may be incident onto each of the first to fourth pixels 101, 102, 103, and 102 of the pixel array 4100.

The first and second metal reflection layers 127 and 128 may include a metal material capable of reflecting light of a certain wavelength region. For example, each of the first and second metal reflection layers 127 and 128 may include Al, Ag, Au, Cu, W, Ti, or TiN. However, this is only an example. The first and second metal reflection layers 127 and 128 may include the same metal material. However, the embodiments are not limited thereto, and the first and second metal reflection layers 127 and 128 may include different metal materials from each other. In addition, the first metal reflection layer (or the second metal reflection layer) arranged at some cavities (e.g., 121, 122, 123, and 124) may include a different metal material from the first metal reflection layer (or the second metal reflection layer) arranged at other cavities (e.g., 121, 122, 123, and 124). The first and second metal reflection layers 127 and 128 may have a thickness of about several tens of nanometers (nm). For example, each of the first and second metal reflection layers 127 and 128 may have a thickness in a range from 10 nm to 50 nm. However, the embodiments are not limited thereto.

The first to fourth cavities 121, 122, 123, and 124 may be provided to have different center wavelengths from each other by adjusting an effective refractive index. To this end, the first to fourth cavities 121, 122, 123, and 124 may include different first patterns from each other corresponding to the center wavelengths. For example, the first cavity 121 may include first patterns corresponding to a first center wavelength, and the second cavity 122 may include first patterns corresponding to a second center wavelength. The third cavity 123 may include first patterns corresponding to a third center wavelength, and the fourth cavity 124 may include first patterns corresponding to a fourth center wavelength.

Each of the first to fourth cavities 121, 122, 123, and 124 may include a first dielectric 125*a*, and a plurality of second dielectrics 125*b* regularly arranged in the first dielectric 125*a* to form the first patterns. The second dielectrics 125*b* may have a different refractive index from the first dielectric 125*a*. Each of the first and second dielectrics 125*a* and 125*b* may include, for example, silicon, silicon oxide, silicon nitride, titanium oxide, etc. Specifically, the first dielectric 125*a* may include a silicon oxide, and the second dielectric 125*b* may include a titanium oxide. However, this is only an example.

Figure 4A:
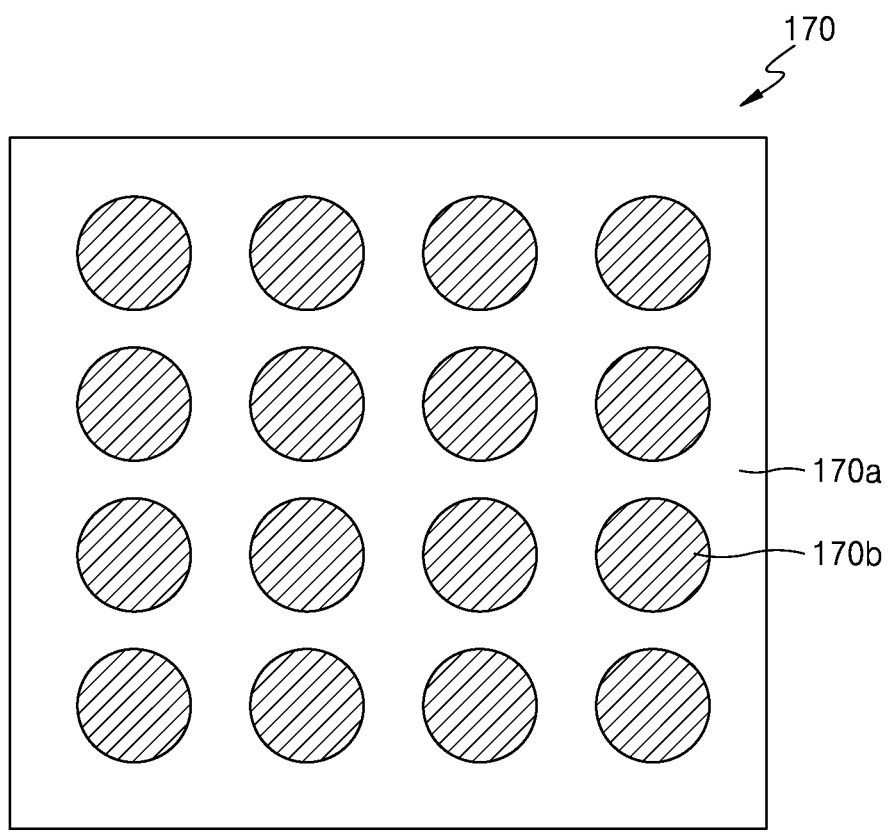
FIGS. 4A and 4B are diagrams illustrating an example of a pattern of a cavity of FIG. 3.
Figure 4B:
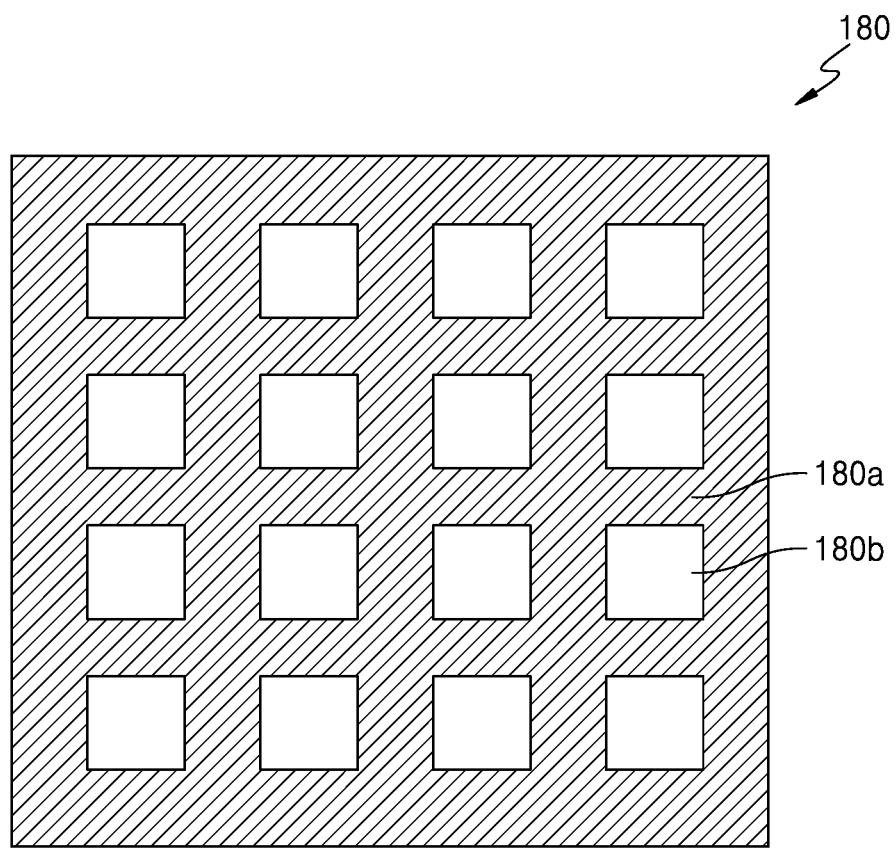

FIGS. 4A and 4B illustrate an example of the first pattern which may be applied to each of the first to fourth cavities 121, 122, 123, and 124. With reference to FIG. 4A, in first patterns 170, second dielectrics 170*b* having a higher refractive index than a first dielectric 170*a* may be arranged in a 2D array in the first dielectric 170*a*. Although FIG. 3A illustrates that each second dielectric 170*b* has a circular cross-section, the second dielectric 170*b* may have various other different cross-section. With reference to FIG. 4B, in first patterns 180, second dielectrics 180*b* having a lower refractive index than a first dielectric 180*a* may be arranged in a 2D array in the first dielectric 180*a*. Although FIG. 4B illustrates that each second dielectric 180*b* has a tetragonal cross-section, the second dielectric 180*b* may have various other different cross-section.

As illustrated in FIG. 3, by varying the size and/or shape of the second dielectric 125*b* regularly arranged in the first dielectric 125*a*, the first patterns which are different from each other may be formed, and accordingly, by varying the effective refractive index, the first to fourth cavities 121, 122, 123, and 124 having different center wavelengths from each other may be formed.

An etch stop layer 129 may be further provided below the first to fourth cavities 121, 122, 123, and 124. The etch stop layer 129 may facilitate a patterning process for forming the first to fourth cavities 121, 122, 123, and 124. The etch stop layer 129 may include, for example, silicon oxide, titanium oxide, and/or hafnium oxide, but the embodiments are not limited thereto.

As described above, the first to fourth cavities 121, 122, 123, and 124 may be formed to have different first patterns from each other which correspond to center wavelengths between the first and second metal reflection layers 127 and 128. Accordingly, the first to fourth cavities 121, 122, 123, and 124 may have the same thickness. For example, the first to fourth cavities 121, 122, 123, and 124 may have a thickness in a range from 50 nm to 1000 nm. However, the embodiments are not limited thereto.

A lower dielectric film 130 may be provided between the resonance layer 120 and the pixel array 4100. The lower dielectric film 130 may be provided to improve the transmittance of unit filters 111, 112, 113, and 114. The lower dielectric film 130 may include a plurality of lower pattern films (i.e., a first lower pattern film 131, a second lower pattern film 132, a third lower pattern film 133, and a fourth lower pattern film 134) provided in correspondence with different center wavelengths.

The lower dielectric film 130 may include the first to fourth lower pattern films 131, 132, 133, and 134. The first to fourth lower pattern films 131, 132, 133, and 134 may respectively be provided under the first to fourth cavities 121, 122, 123, and 124. The first to fourth lower pattern films 131, 132, 133, and 134 may correspond to different center wavelengths by adjusting the effective refractive index.

Similar to the first to fourth cavities 121, 122, 123, and 124 described above, the first to fourth lower pattern films 131, 132, 133, and 134 may include different second patterns from each other which correspond to center wavelengths. For example, the first lower pattern film 131 may include second patterns corresponding to a first center wavelength, and the second lower pattern film 132 may include second patterns corresponding to a second center wavelength. The third lower pattern film 133 may include second patterns corresponding to a third center wavelength, and the fourth lower pattern film 134 may include second patterns corresponding to a fourth center wavelength.

The second patterns of each of the first to fourth lower pattern films 131, 132, 133, and 134 may have a shape similar to the first patterns of each of the first to fourth cavities 121, 122, 123, and 124. Each of the first to fourth lower pattern films 131, 132, 133, and 134 may include a third dielectric 135*a*, and a plurality of fourth dielectrics 135*b* regularly arranged in the third dielectric 135*a* to form the second patterns. The fourth dielectrics 135*b* may have a different refractive index from the third dielectric 135*a*. Each of the third and fourth dielectrics 135*a* and 135*b* may include, for example, titanium oxide, silicon nitride, hafnium oxide, silicon oxide, and/or high index polymer, but the embodiments are not limited thereto.

By varying the size and/or shape of the fourth dielectrics 135b regularly arranged in the third dielectric 135a, second patterns which are different each other may be formed, and accordingly, as the effective refractive index is changed, the first to fourth lower pattern films 131, 132, 133, and 134 corresponding to different center wavelengths from each other may be formed.

An etch stop layer 139 may be further provided under the first to fourth pattern films 131, 132, 133, and 134. The etch stop layer 139 may facilitate a patterning process for forming the first to fourth pattern films 131, 132, 133, and 134. The etch stop layer 139 may include, for example, silicon oxide, titanium oxide, and/or hafnium oxide, but the embodiments are not limited thereto.

As described above, the first to fourth lower pattern films 131, 132, 133, and 134 may include different second patterns from each other which correspond to center wavelengths. Accordingly, similar to the first to fourth cavities 121, 122, 123, and 124 described above, the first to fourth lower pattern films 131, 132, 133, and 134 may have the same thickness. For example, the first to fourth lower pattern films 131, 132, 133, and 134 may have a thickness in a range from 100 nm to 1000 nm. However, the embodiments are not limited thereto.

An upper dielectric film 240 may be further provided on the resonance layer 120. The upper dielectric film 240 may be provided to improve the transmittance of the unit filters. The upper dielectric film 240 may include a plurality of upper pattern films (i.e., a first upper pattern film 241, a second upper pattern film 242, a third upper pattern film 243, and a fourth upper pattern film 244) provided in correspondence with different center wavelengths.

The upper dielectric film 240 may include the first to fourth upper pattern films 241, 242, 243, and 244. The first to fourth upper pattern films 241, 242, 243, and 244 may respectively be provided under the first to fourth cavities 121, 122, 123, and 124.

The first to fourth upper pattern films 241, 242, 243, and 244 may correspond to different center wavelengths by adjusting the effective refractive index. The first to fourth upper pattern films 241, 242, 243, and 244 may include different third patterns from each other corresponding to the center wavelengths. For example, the first upper pattern film 241 may include third patterns corresponding to a first center wavelength, and the second upper pattern film 242 may include third patterns corresponding to a second center wavelength. The third upper pattern film 243 may include third patterns corresponding to a third center wavelength, and the fourth upper pattern film 244 may include third patterns corresponding to a fourth center wavelength.

The third patterns of each of the first to fourth upper pattern films 241, 242, 243, and 244 may have a shape similar to the second patterns of each of the first to fourth lower pattern films 131, 132, 133, and 134. Each of the first to fourth upper pattern films 241, 242, 243, and 244 may include a fifth dielectric 245a, and a plurality of sixth dielectrics 245b regularly arranged in the fifth dielectric 245a to form the third patterns. The sixth dielectrics 245b may have a different refractive index from the fifth dielectric 245a. Each of the fifth and sixth dielectrics 245a and 245b may include, for example, titanium oxide, silicon nitride, hafnium oxide, silicon oxide, and/or high index polymer, but the embodiments are not limited thereto.

By varying the size and/or shape of the sixth dielectrics 245b regularly arranged in the fifth dielectric 245a, third patterns which are different each other may be formed, and accordingly, as the effective refractive index is changed, the first to fourth upper pattern films 241, 242, 243, and 244 corresponding to different center wavelengths from each other may be formed.

An etch stop layer 249 may be further provided under the first to fourth upper pattern films 241, 242, 243, and 244. The etch stop layer 249 may include, for example, silicon oxide, titanium oxide, and/or hafnium oxide, but the embodiments are not limited thereto.

As described above, the first to fourth upper pattern films 241, 242, 243, and 244 may include different third patterns from each other which correspond to center wavelengths. Accordingly, similar to the first to fourth cavities 121, 122, 123, and 124 and the first to fourth pattern films 131, 132, 133, and 134 described above, the first to fourth upper pattern films 241, 242, 243, and 244 may have the same thickness. For example, the first to fourth upper pattern films 241, 242, 243, and 244 may have a thickness in a range from 100 nm to 1000 nm. However, the embodiments are not limited thereto.

Figure 5:
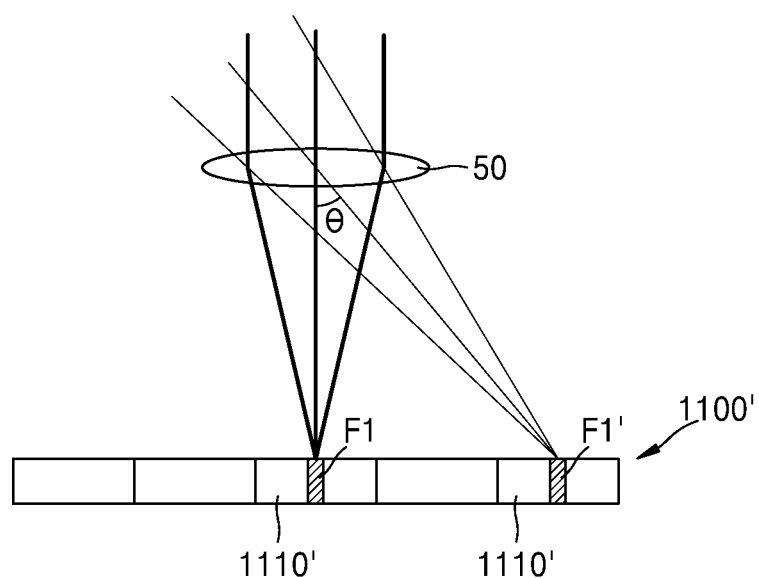
FIG. 5 is a diagram of a spectral filter according to a comparative example.

FIG. 5 is a diagram of a spectral filter 1100' according to a comparative example.

With reference to FIG. 5, the spectral filter 1100' may include a plurality of filter arrays 1110' arranged in a 2D manner, and each of the filter arrays 1110' may include a plurality of unit filters having different center wavelengths from each other. The plurality of filter arrays 1110' may have the same structure. For example, the unit filters of the filter array 1110' located at the center of the spectral filter 1100' may be identical to the unit filters constituting the filter array 1110' located at an outer position of the spectral filter 1100'.

FIG. 5 illustrates an example of a first unit filter F1 of the filter array 1110' located at the center of the spectral filter 1100' and a first unit filter F1' of the filter array 1110' located at an outer position of the spectral filter 1100'. The first unit filter F1 located at the center of the spectral filter 1100' and the first unit filter F1' located at an outer position of the spectral filter 1100' may be constituted identically.

With reference to FIG. 5, incident light may be incident vertically through an optical system 50 in the first unit filter F1 located at the center of the spectral filter 1100', and incident light may be incident obliquely through the optical system 50 in the first unit filter F1' located at an outer position of the spectral filter 1100'. A chief ray angle (CRA) of light incident onto the first unit filter F1 located at the center of the spectral filter 1100' may be 0, and a CRA of light incident onto the first unit filter F1' located at an outer position of the spectral filter 1100' may be a certain angle (θ).

The CRA (θ) of incident light may increase from the center of the spectral filter 1100' towards an outer position of the spectral filter 1100', and in the spectral filter 1100' according to the comparative example, as the CRA of incident light increases, the effect of shift of a center wavelength of unit filters towards a short wavelength may occur.

Figure 6:
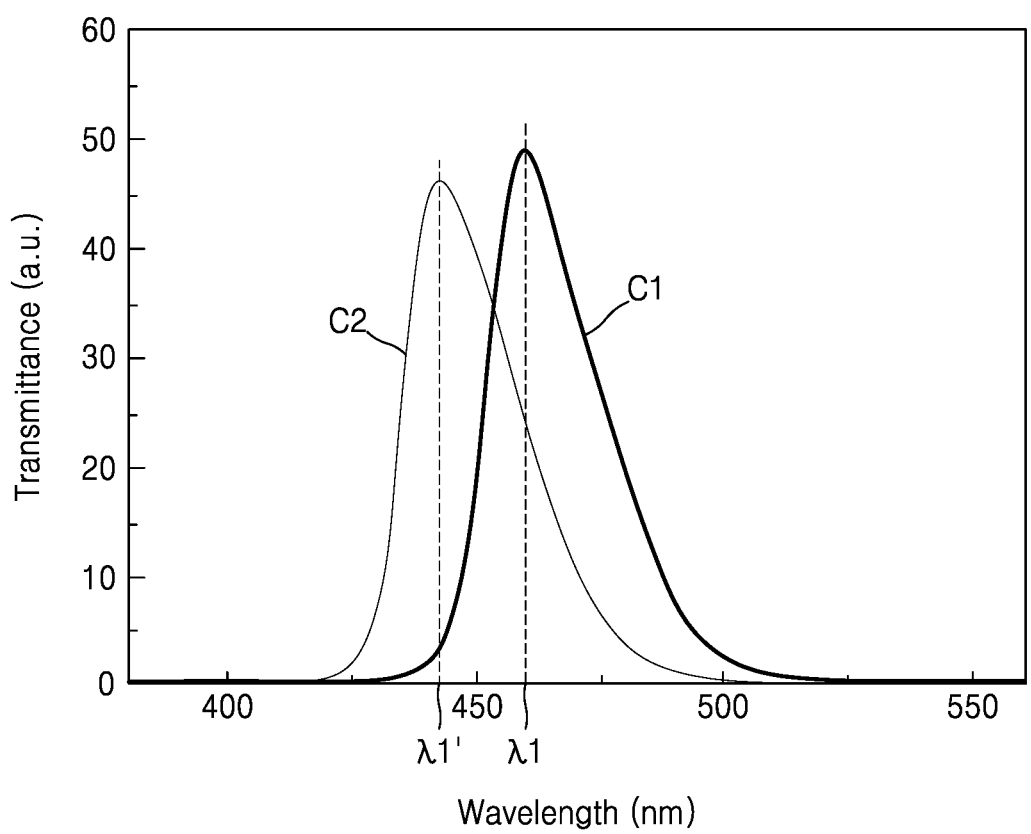
FIG. 6 illustrates transmission spectra showing a center wavelength shift according to a change of a chief ray angle of incident light in the spectral filter of FIG. 5.

FIG. 6 illustrates an example of simulation result showing a center wavelength shift according to a change of CRA of incident light in the spectral filter 1100' of FIG. 5. In FIG. 6, C1 shows a transmission spectrum of the first unit filter F1 located at the center of the spectral filter 1100' in which the CRA of incident is 0°, and C2 shows a transmission spectrum of the first unit filter F1' located at an outer position of the spectral filter 1100' in which the CRA of incident light is 30°.

With reference to FIG. 6, the center wavelength of the first unit filter F1 located at the center of the spectral filter 1100' is $\lambda_1$ whereas the center wavelength of the first unit filter F1' located at an outer position of the spectral filter 1100' is shifted to $\lambda_1$' which is shorter than $\lambda_1$.

As such, in the spectral filter 1100' according to the comparative example, as change of the CRA of incident light causes the center wavelength shift, the unit filter located at the center of the spectral filter 1100' and the unit filter located at an outer position of the spectral filter 1100' may have the same center wavelength even when they have the same structure.

In some embodiments, the spectral filter 1100 capable of compensating for the center wavelength shift caused according to the CRA of incident light by changing the effective refractive index of the cavity and the lower pattern film according to the position of the unit filter may be provided.

Hereinafter, descriptions are provided by taking the example of the first unit filters (F1, F1', and F1") having the same center wavelength and arranged at different positions from each other, among the unit filters of the filter arrays 1110 constituting the spectral filter 1100.

Figure 7:
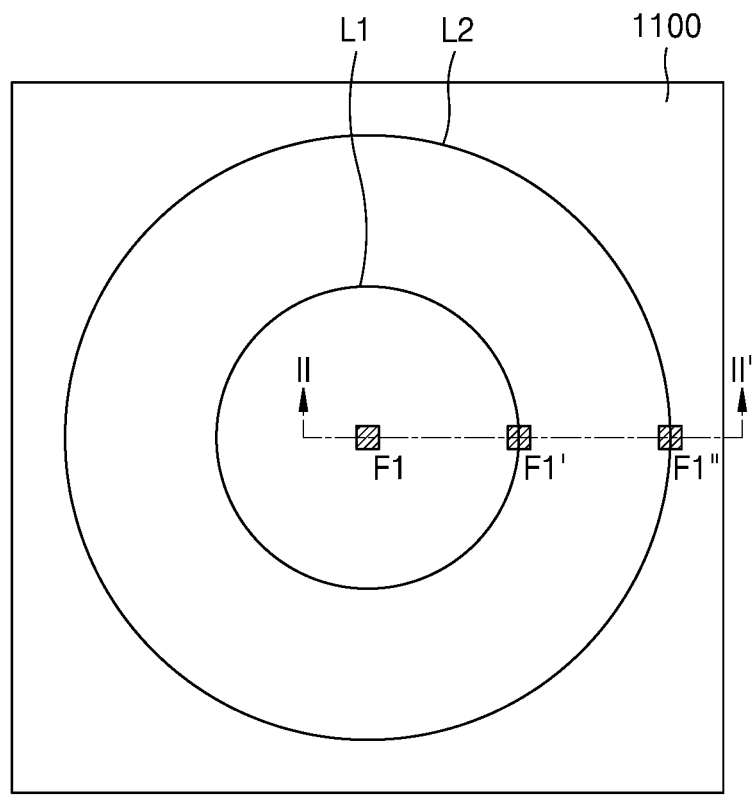
FIG. 7 is a plan view of unit filters arranged at different positions in a spectral filter according to an embodiment.
Figure 8:
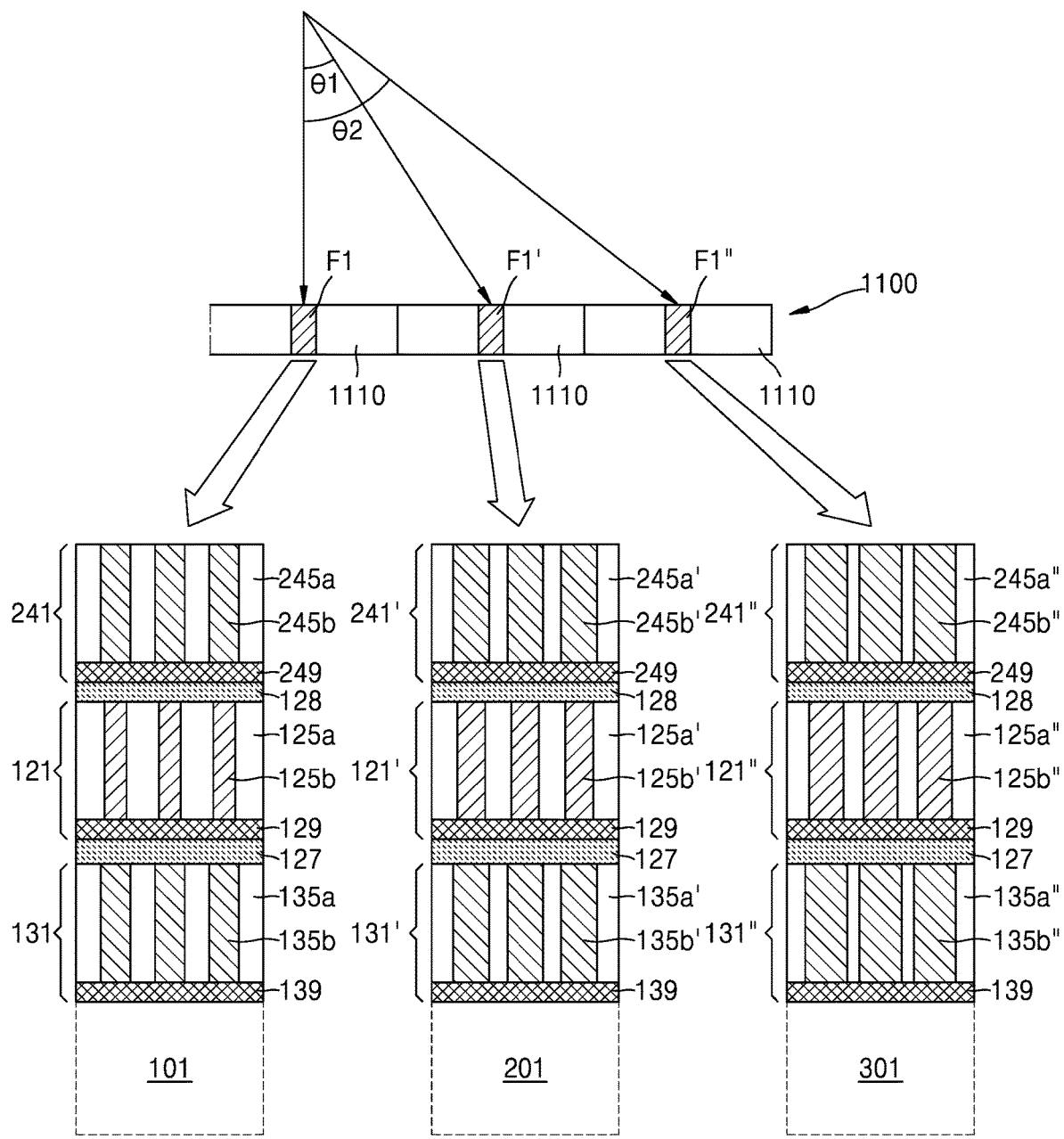
FIG. 8 is a cross-sectional view taken along the line II-II' in FIG. 7.

FIG. 7 is a plan view of the first unit filters (F1, F1', and F1") arranged at different positions in the spectral filter 1100 according to an embodiment, and FIG. 8 is a cross-sectional view taken along the line II-II' in FIG. 7.

In FIGS. 7 and 8, L1 shows a circle connecting the first positions in which the CRA of incident light is $\theta_1$, and L2 shows a circle connecting the second positions in which the CRA of incident light is $\theta_2$ ($>\theta_1$). F1 represents a first unit filter located at the center of the spectral filter, F1' represents a first unit filter in which a CRA of incident light is $\theta_1$, and F1" represents a first unit filter in which a CRA of incident light is $\theta_2$. The first unit filters (F1, F1', and F1") located at different positions from each other may have the same center wavelength.

With reference to FIGS. 7 and 8, each of the first unit filters F1, F1', and F1") may include the first and second metal reflection layers 127 and 128 which are apart from each other, the first cavity (121, 121', and 121") arranged between the first and second metal reflection layers 127 and 128, and the first lower pattern film (131, 131', and 131") arranged under the first metal reflection layer 127. The first upper pattern film (241, 241', and 241") may be further provided on the second metal reflection layer 128. Pixels (101, 201, and 301) of the pixel array 4100 may be arranged under the first lower pattern film (131, 131', and 131").

The first cavity (121, 121', and 121") may include the first dielectric (125a, 125a', and 125a") and the plurality of second dielectrics (125b, 125b', and 125b") regularly arranged in the first dielectric (125a, 125a', and 125a") to from the first patterns. The second dielectrics (125b, 125b', and 125b") may have a different refractive index than the first dielectric (125a, 125a', and 125a"). The first lower pattern film (131, 131', and 131") may include the third dielectric (135a, 135a', and 135a") and the plurality of fourth dielectrics (135b, 135b', and 135b") regularly arranged in the third dielectric (135a, 135a', and 135a") to from the second patterns. The fourth dielectrics (135b, 135b', and 135b") may have a different refractive index than the third dielectric (135a, 135a', and 135a"). The first upper pattern film (241, 241', and 241") may include the fifth dielectric (245a, 245a', and 245a") and the plurality of sixth dielectrics (245b, 245b', and 245b") regularly arranged in the fifth dielectric (245a, 245a', and 245a") to from the third patterns. The sixth dielectrics (245b, 245b', and 245b") may have a different refractive index than the fifth dielectric (245a, 245a', and 245a").

In some embodiments, to compensate for the center wavelength shift caused according to change of chief ray angle of incident light, the effective refractive index of the first cavity (121, 121', and 121") and the first lower pattern film (131, 131', and 131") may be adjusted according to the position of the first unit filter (F1, F1', and F1"). In addition, the effective refractive index of the first upper pattern film (241, 241', and 241") may be adjusted according to the position of the first unit filter (F1, F1', and F1").

The effective refractive index of the first cavity (121, 121', and 121") may be changed by varying the first pattern of the first cavity (121, 121', and 121") according to the position of the first unit filter (F1, F1', and F1"). The effective refractive index of the first cavity (121, 121', and 121") may be adjusted to the extent that it compensates for the center wavelength shift caused according to the chief ray angle of the incident light. When the position of the first unit filters (F1, F1', and F1") moves from the center of the spectral filter 1100 towards an outer position of the spectral filter 1100, the chief ray angle of incident light may increase, which may lead to greater center wavelength shift effects. Accordingly, to compensate for the center wavelength shift, the change in the effective refractive index of the first cavity (121, 121', and 121") may become greater when the position of the first unit filter (F1, F1', and F1") moves from the center of the spectral filter towards an outer position of the spectral filter.

Figure 9:
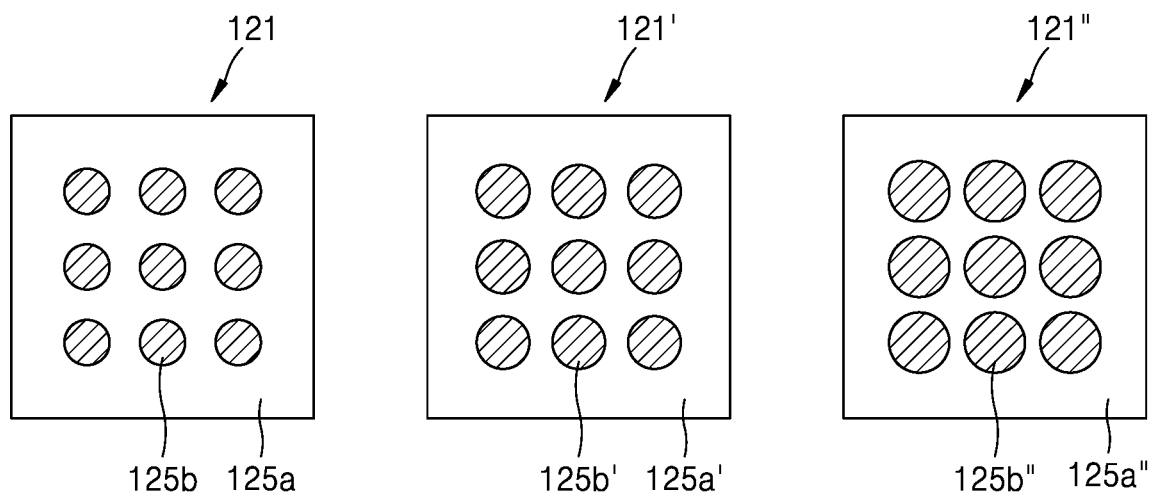
FIG. 9 is an internal plan view of a first cavity of a first unit filter at a center of a spectral filter, a first cavity of a first unit filter at a first position, and a first cavity of a first unit filter at a second position in FIG. 8.

The size of the first pattern of the first cavity (121, 121', and 121") may vary according to the position of the first unit filter (F1, F1', and F1"). Specifically, the size of the first pattern of the first cavity (121, 121', and 121") may vary according to a change of the position of the first unit filter (F1, F1', and F'") from the center of the spectral filter 1100 towards an outer position of the spectral filter 1100. FIG. 9 is a plan view illustrating an example of the first cavity 121 of the first unit filter F1 located at the center of the spectral filter 1100, the first cavity 121' of the first unit filter F1' located at the first position, and the first cavity 121" of the first unit filter F1" located at the second position. With reference to FIG. 9, when the position of the first unit filter (F1, F1', and F1") moves from the center of the spectral filter 1100 towards an outer position of the spectral filter 1100, the size of the first pattern of the first cavity (121, 121', and 121") may increase. However, the embodiments are not limited thereto, and the size of the first pattern of the first cavity (121, 121', and 121") may decrease as the position of the first unit filter (F1, F1', and F1") moves from the center towards an outer position of the spectral filter 1100, according to a material constituting the first and second dielectrics.

The effective refractive index of the first lower pattern film (131, 131', and 131") may be changed by varying the second pattern of the first lower pattern film (131, 131', and 131") according to the position of the first unit filter (F1, F1', and F1"). The effective refractive index of the first lower pattern film (131, 131', and 131") may be adjusted to the extent that it compensates for the center wavelength shift caused according to the chief ray angle of the incident light.

The size of the second pattern of the first lower pattern film (131, 131', and 131") may vary according to the position of the first unit filter (F1, F1', and F1"). Specifically, the size of the second pattern of the first lower pattern film (131, 131', and 131") may increase or decrease according to a change of the position of the first unit filter (F1, F1', and F'")

from the center of the spectral filter 1100 towards an outer position of the spectral filter 1100.

The effective refractive index of the first upper pattern film (241, 241', and 241") may be changed by varying the third pattern of the first upper pattern film (241, 241', and 241") according to the position of the first unit filter (F1, F1', and F1"). The effective refractive index of the first upper pattern film (241, 241', and 241") may be adjusted to the extent that it compensates for the center wavelength shift caused according to the chief ray angle of the incident light. The size of the third pattern of the first upper pattern film (241, 241', and 241") may vary according to the position of the first unit filter (F1, F1', and F1").

Figure 10:
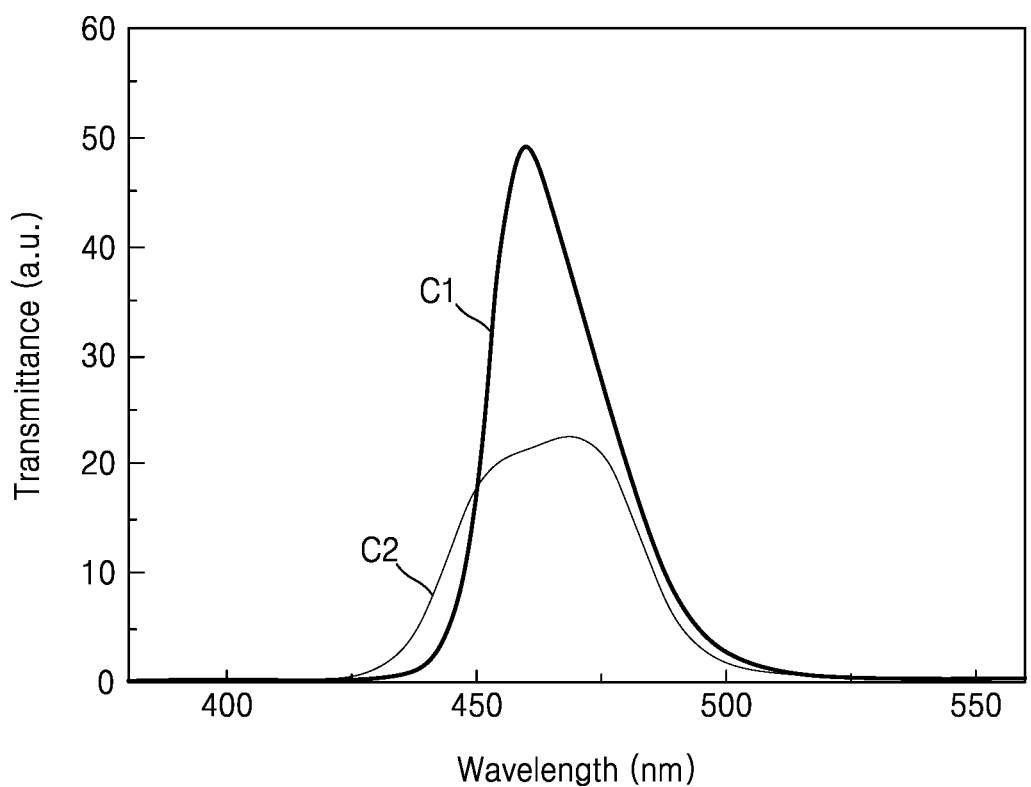
FIG. 10 illustrates transmission spectra obtained when only an effective refractive index of a first cavity in the spectral filter of FIG. 8 is changed.

FIG. 10 illustrates simulation results showing transmission spectra obtained when only an effective refractive index of a first cavity in the spectral filter of FIG. 8 is changed. In FIG. 10, C1 shows a transmission spectrum of the first unit filter at a position in which the CRA of incident is 0°, and C2 shows a transmission spectrum of the first unit filter at a position in which the CRA of incident light is 30°.

With reference to FIG. 10, by adjusting the effective refractive index of the first cavity, the first unit filter at the position in which the CRA of incident light is 30° may have the same center wavelength with the first unit filter at the position in which the CRA of incident light is 0°, but the transmittance of the first unit filter at the position in which the CRA of incident light is 30° may be lower than that of the first unit filter at the position in which the CRA of incident light is 0°.

Figure 11:
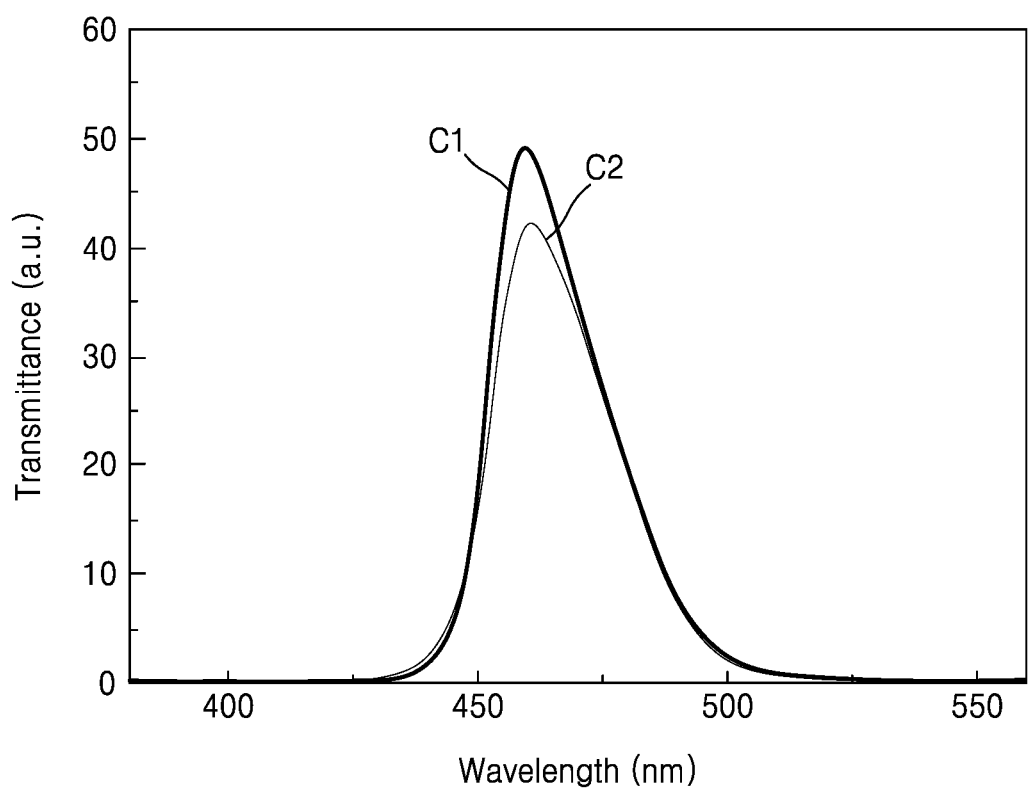
FIG. 11 illustrates transmission spectra obtained when an effective refractive index of a first cavity, a first lower pattern film, and a first upper pattern film in the spectral filter of FIG. 8 is changed.

FIG. 11 illustrates transmission spectra obtained when an effective refractive index of a first cavity, a first lower pattern film, and a first upper pattern film in the spectral filter of FIG. 8 is changed. In FIG. 11, C1 shows a transmission spectrum of the first unit filter at a position in which the CRA of incident is 0°, and C2 shows a transmission spectrum of the first unit filter at a position in which the CRA of incident light is 30°.

With reference to FIG. 11, by adjusting the effective refractive index of the first cavity, the first lower pattern film, and the first upper pattern film, the first unit filter at the position in which the CRA of incident light is 30° may have the same center wavelength and a similar transmittance with the first unit filter at the position in which the CRA of incident light is 0°.

As such, in the spectral filter 1100, as the position of the first unit filter (F1, F1', and F1") changes, the effective refractive index of the first cavity (121, 121', and 121"), the first lower pattern film (131, 131', and 131"), and the first upper pattern film (241, 241', and 241") may vary, and thus, the center wavelength shift caused according to a change of CRA of incident light may be compensated. In this manner, the first unit filters (F1, F1', and F1") located at different positions from each other may have the same center wavelength.

Figure 12:
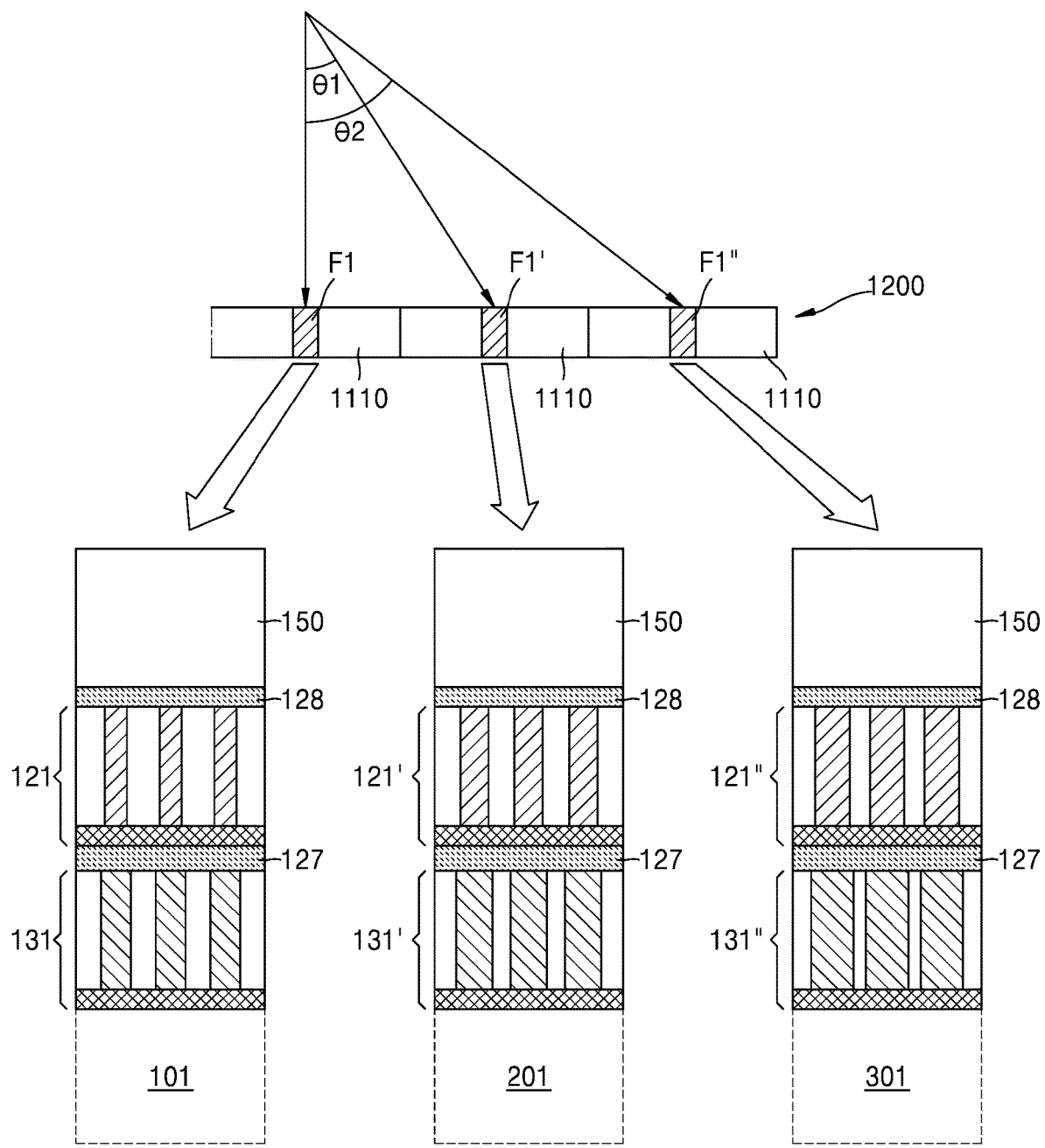
FIG. 12 is a diagram of a spectral filter according to another embodiment.

FIG. 12 is a diagram of a spectral filter 1200 according to another embodiment. The spectral filter 1200 of FIG. 12 may be identical to the spectral filter 1100 of FIG. 8 except that instead of the upper pattern film, a color filter 150 is provided on the first cavity (121, 121', and 121").

With reference to FIG. 12, the size of the first pattern of the first cavity (121, 121', and 121") may vary according to the position of the first unit filter (F1, F1', and F1"). Specifically, the size of the first pattern of the first cavity (121, 121', and 121") may vary according to a change of the position of the first unit filter (F1, F1', and F") from the center of the spectral filter 1100 towards an outer position of the spectral filter 1100. The size of the second pattern of the first lower pattern film (131, 131', and 131") may vary according to the position of the first unit filter (F1, F1', and F1").

The color filter 150 may be provided on the first cavity (121, 121', and 121"). The color filter 150 may block light of certain wavelength bands which are not desired by the first unit filters (F1, F1', and F1"). For example, the color filter 150 may include a blue color filter, a green color filter, or a red color filter.

Figure 13:
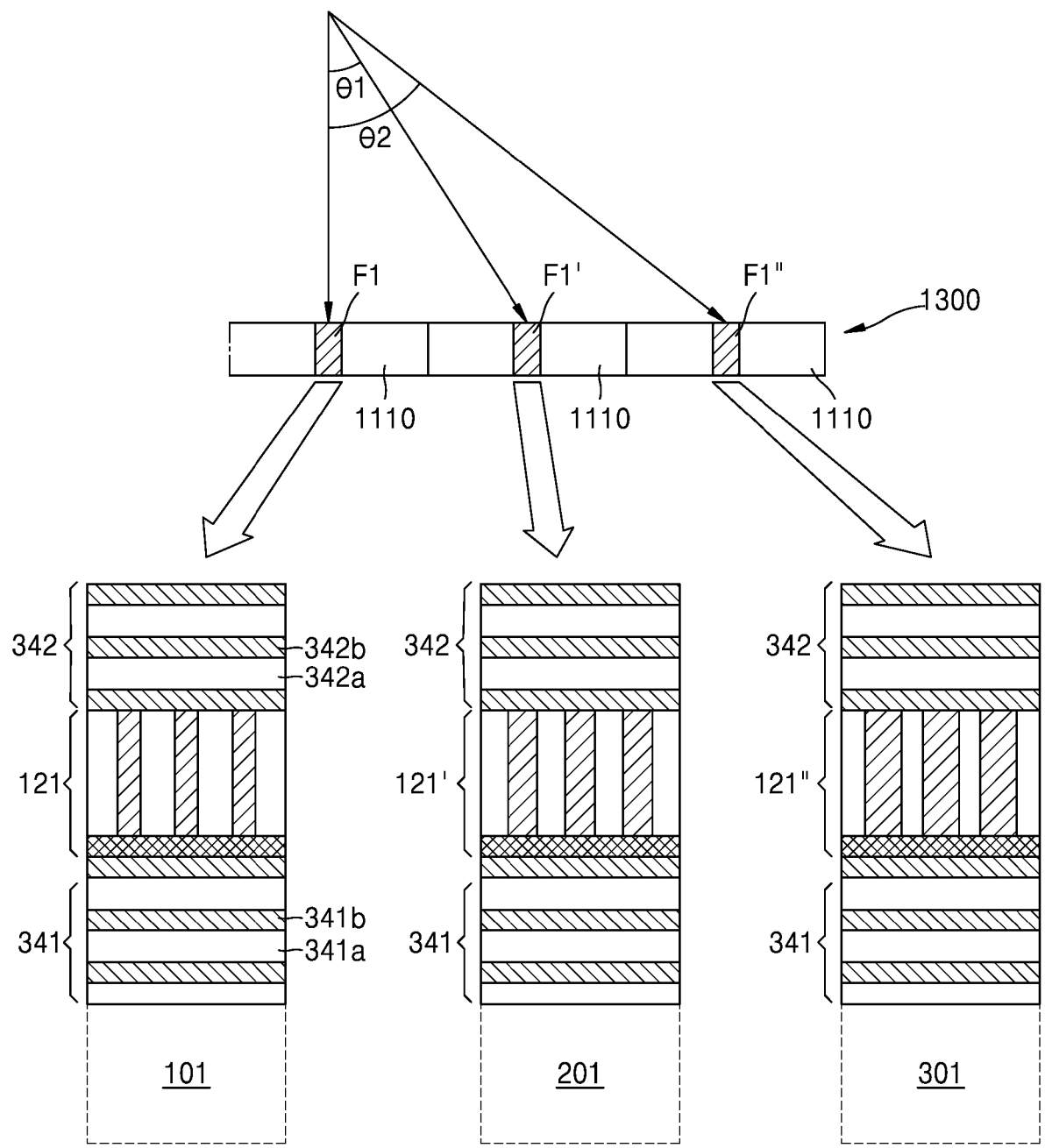
FIG. 13 is a diagram of a spectral filter according to another embodiment.

FIG. 13 is a diagram of a spectral filter 1300 according to another embodiment.

With reference to FIG. 13, the spectral filter 1300 may include a plurality of filter arrays 1110 arranged in a 2D manner, and each of the filter arrays 1110 may include a plurality of unit filters having different center wavelengths from each other. FIG. 13 illustrates an example of first unit filters (F1, F1', and F1") which are selected from each of the plurality of filter arrays, have the same center wavelength, and are located at different positions from each other. The first unit filters (F1, F1', and F1") may have the same center wavelength.

Each of the first unit filters (F1, F1', and F1") may include a first Bragg reflection layer 341, a second Bragg reflection layer 342, and the first cavity (121, 121', and 121") may be arranged between the first and second Bragg reflection layers 341 and 342.

The first and second Bragg reflection layers 341 and 342 may be a distributed Bragg reflector (DBR). The first Bragg reflection layer 341 may have a structure in which a first material layer 341*a* and a second material layer 341*b* having different refractive index from each other are alternately stacked. The second Bragg reflection layer 342 may have a structure in which a third material layer 342*a* and a fourth material layer 342*b* having different refractive index from each other are alternately stacked.

The first cavity (121, 121', and 121") may include the first dielectric (125*a*, 125*a'*, and 125*a"*) and the plurality of second dielectrics (125*b*, 125*b'*, and 125*b"*) regularly arranged in the first dielectric (125*a*, 125*a'*, and 125*a"*) to from the first patterns. The second dielectrics (125*b*, 125*b'*, and 125*b"*) may have a different refractive index than the first dielectric (125*a*, 125*a'*, and 125*a"*).

The effective refractive index of the first cavity (121, 121', and 121") may be changed by varying the first pattern of the first cavity (121, 121', and 121") according to the position of the first unit filter (F1, F1', and F1"). The effective refractive index of the first cavity (121, 121', and 121") may be adjusted to the extent that it compensates for the center wavelength shift caused according to the chief ray angle of the incident light.

The size of the first pattern of the first cavity (121, 121', and 121") may vary according to the position of the first unit filter (F1, F1', and F1"). Specifically, the size of the first pattern of the first cavity (121, 121', and 121") may vary according to a change of the position of the first unit filter (F1, F1', and F") from the center of the spectral filter 1100 towards an outer position of the spectral filter 1100.

Figure 14:
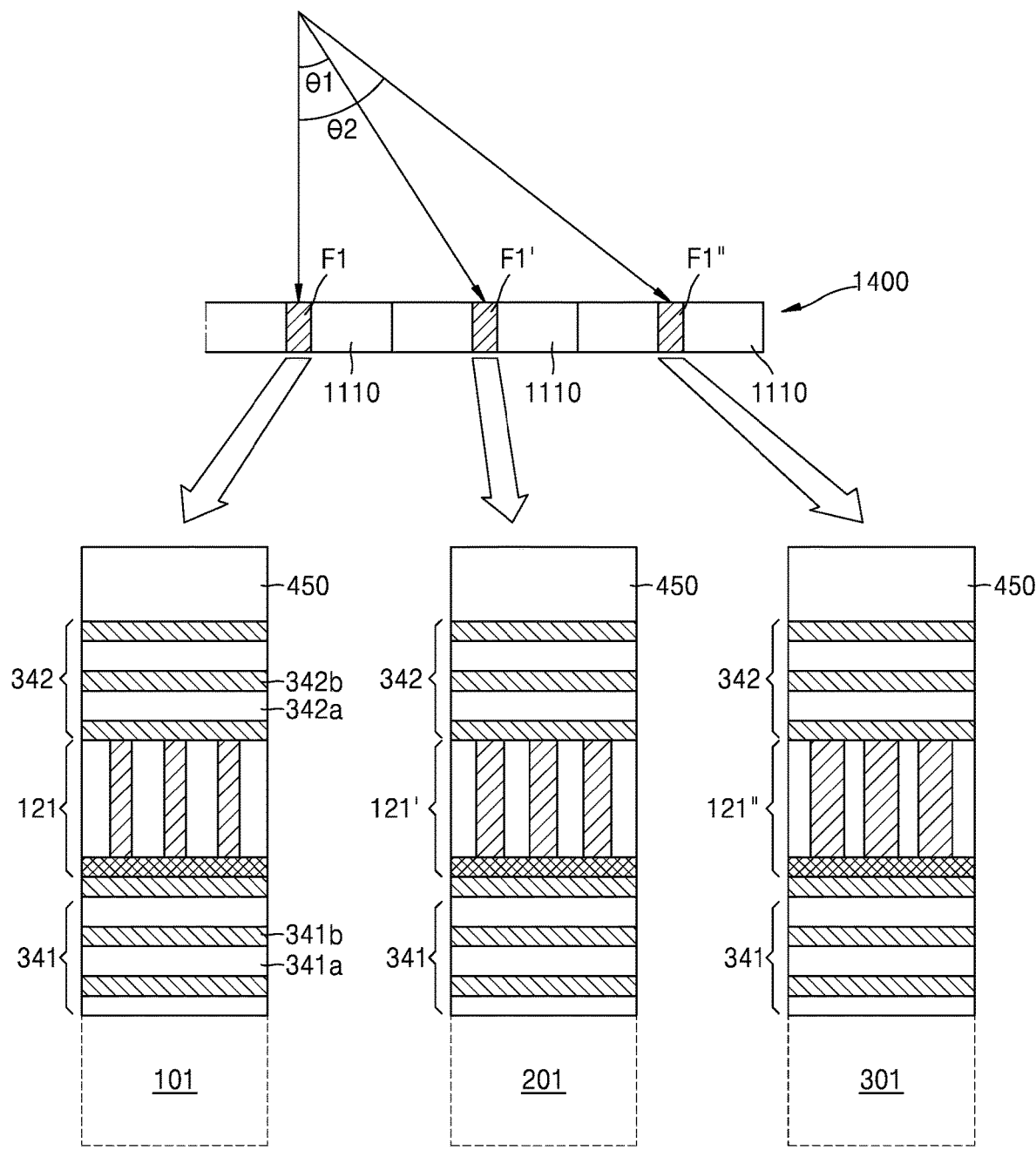
FIG. 14 is a diagram of a spectral filter according to another embodiment.

FIG. 14 is a diagram of a spectral filter 1400 according to another embodiment. The spectral filter 1400 of FIG. 14 may be identical to the spectral filter 1300 of FIG. 13 except that the spectral filter 1400 further includes a color filter 450.

With reference to FIG. 14, the color filter 450 may be provided on the second Bragg reflection layer 342. The color filter 450 may block light having a wavelength band which is not desired by the first unit filters (F1, F1', and F1"), and the color filter 450 may include, for example, a blue color filter, a green color filter, or a red color filter.

Figure 15:
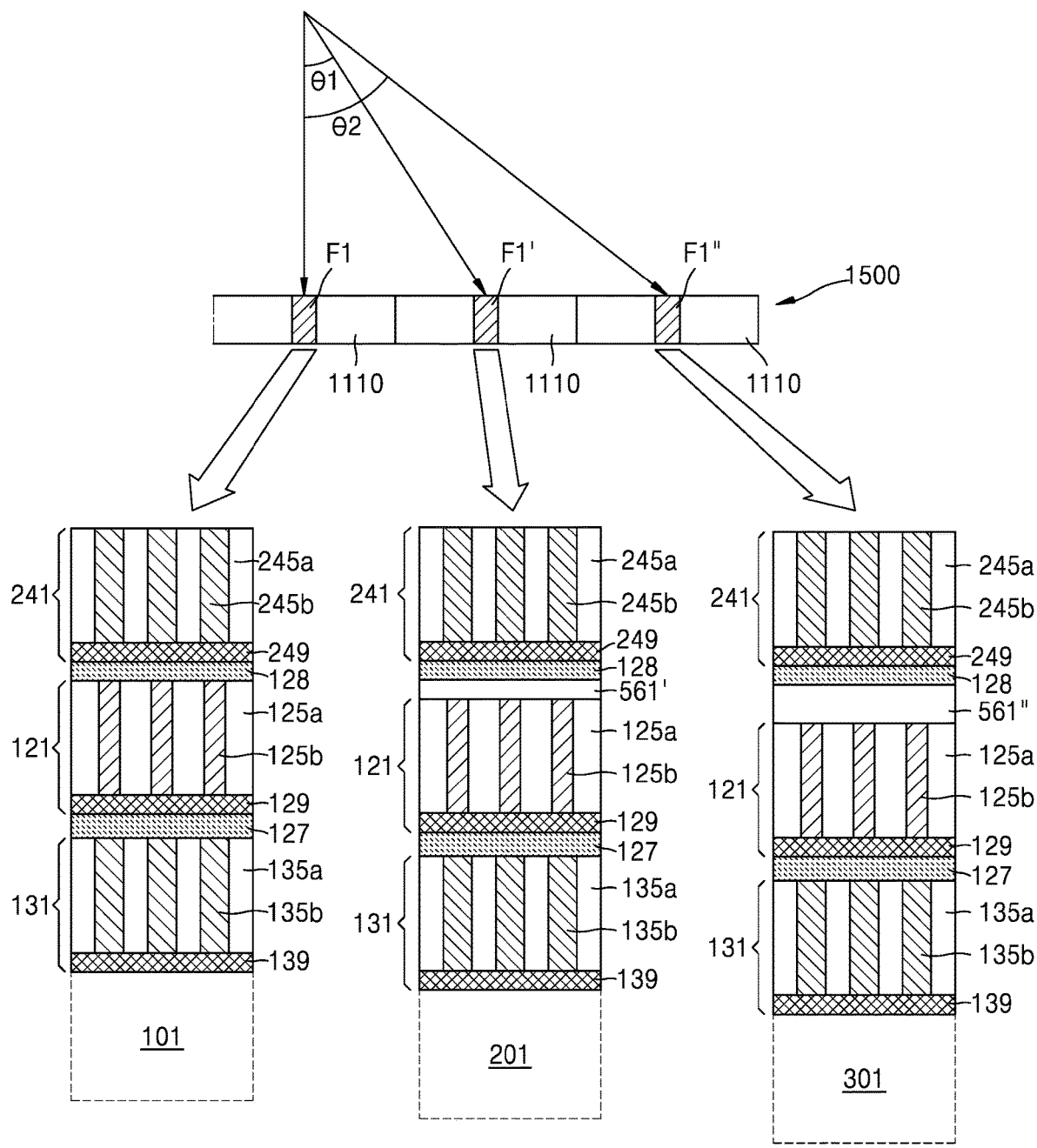
FIG. 15 is a diagram of a spectral filter according to another embodiment.

FIG. 15 is a diagram of a spectral filter 1500 according to another embodiment.

With reference to FIG. 15, the spectral filter 1500 may include a plurality of filter arrays 1110 arranged in a 2D manner, and each of the filter arrays 1110 may include a plurality of unit filters having different center wavelengths from each other. FIG. 15 illustrates an example of the first unit filter F1 located at the center of the spectral filter 1500, the first unit filter F1' located at the first position in which the chief ray angle of incident light is $\theta_1$, and the first unit filter F1" located at the second position in which the chief ray angle of incident light is $\theta_2$, among the unit filters of each filter array 1110. The first unit filters (F1, F1', and F1") may have the same center wavelength.

Each of the first unit filters F1, F1', and F1") may include the first and second metal reflection layers 127 and 128 which are apart from each other, the first cavity 121 arranged between the first and second metal reflection layers 127 and 128, and the first lower pattern film 131 arranged under the first metal reflection layer 127. The first upper pattern film 241 may be further provided on the second metal reflection layer 128.

Each first cavity 121 may include a first dielectric 125a, and a plurality of second dielectrics 125b regularly arranged in the first dielectric 125a to form the first patterns. The first cavities 121 may include the first patterns having the same size with respect to all of the first unit filters (F1, F1', and F1").

Each first lower pattern film 131 may include a third dielectric 135a, and a plurality of fourth dielectrics 135b regularly arranged in the third dielectric 135a to form the second patterns. The first lower pattern films 131 may include the second patterns having the same size with respect to all of the first unit filters (F1, F1', and F1").

Each first upper pattern film 241 may include a fifth dielectric 245a, and a plurality of sixth dielectrics 245b regularly arranged in the fifth dielectric 245a to form the third patterns. The first upper pattern films 241 may include the third patterns having the same size with respect to all of the first unit filters (F1, F1', and F1").

The first unit filter F1' located at the first position may further include a first wavelength shift compensation layer 561' arranged between the first cavity 121 and the second metal reflection layer 128, and the first unit filter F1" located at the second position may further include a second wavelength shift compensation layer 561" arranged between the first cavity 121 and the second metal reflection layer 128. The first and second wavelength shift compensation layers 561' and 561" may be provided to compensate for the center wavelength shift caused according to the position of the first unit filter (F1' and F1").

The first and second wavelength shift compensation layers 561' and 561" may include a certain dielectric material, for example, a silicon nitride, but the embodiments are not limited thereto. The first and second wavelength shift compensation layers 561' and 561" may have a thickness in a range from 1 nm to 30 nm; however, this is only an example.

The first and second wavelength shift compensation layers 561' and 561" may have different thicknesses from each to adjust the effective refractive index according to the position of the first unit filter (F1' and F1"). For example, when the position of the first unit filters (F1, F1', and F1") moves from the center of the spectral filter 1500 towards an outer position of the spectral filter 1500, the chief ray angle of incident light may increase, which leads to greater center wavelength shift effects. Accordingly, to compensate for such center wavelength shift, the second wavelength shift compensation layer 561" may have a greater thickness than the first wavelength shift compensation layer 561'.

The foregoing embodiments describes the case where the first and second wavelength shift compensation layers 561' and 561" are provided only at the first cavity 121. However, the embodiments are not limited thereto, and the first and second wavelength shift compensation layers 561' and 561" may be further provided at the first lower pattern film 131 and/or the first upper pattern film 241.

Figure 16:
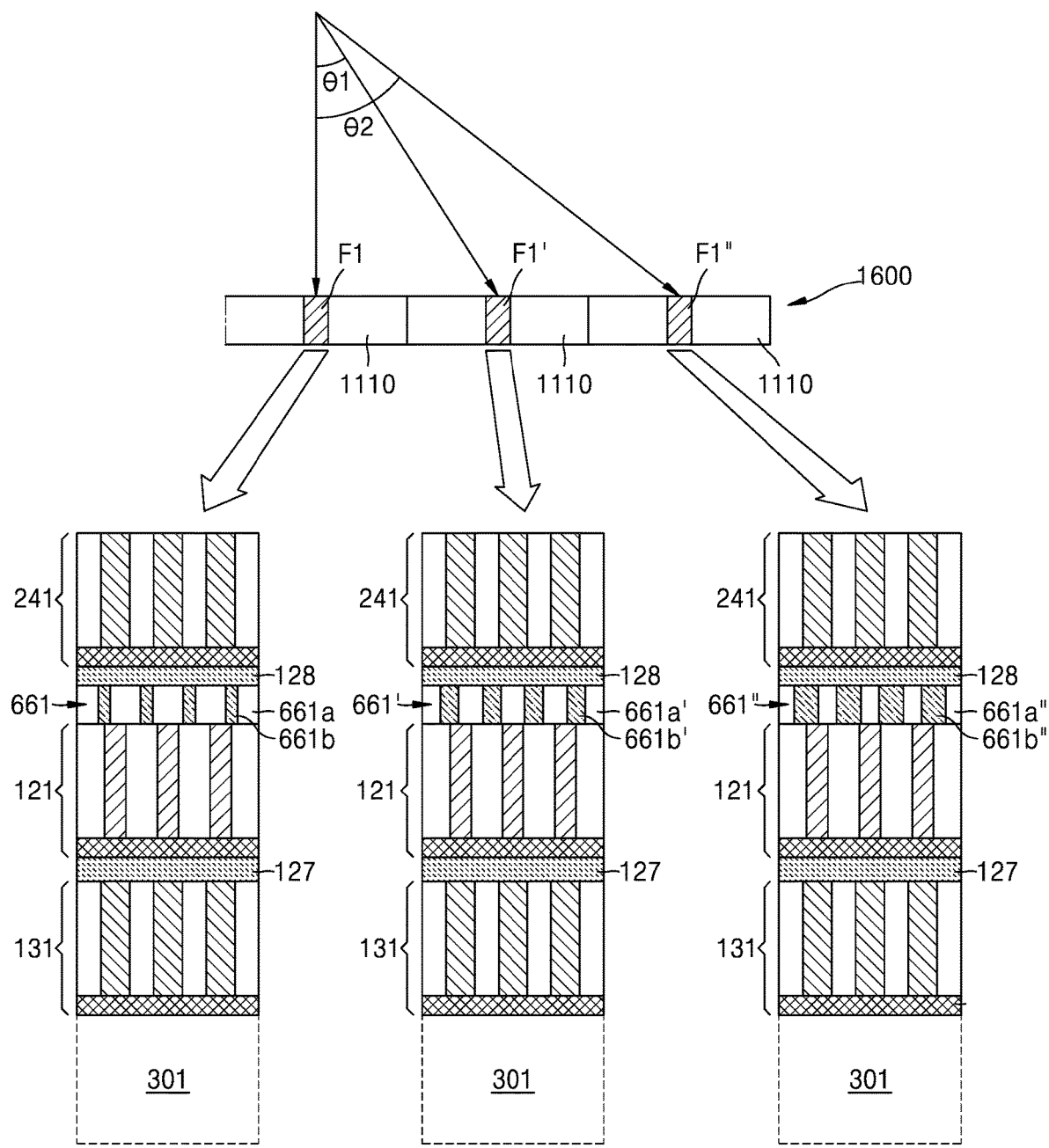
FIG. 16 is a diagram of a spectral filter according to another embodiment.

FIG. 16 is a diagram of a spectral filter 1600 according to another embodiment.

With reference to FIG. 16, each of the first unit filters F1, F1', and F1") may include the first and second metal reflection layers 127 and 128 which are apart from each other, the first cavity 121 arranged between the first and second metal reflection layers 127 and 128, and the first lower pattern film 131 arranged under the first metal reflection layer 127. The first upper pattern film 241 may be further provided on the second metal reflection layer 128.

Each first cavity 121 may include a first dielectric 125a, and a plurality of second dielectrics 125b regularly arranged in the first dielectric 125a to form the first patterns. The first cavities 121 may include the first patterns having the same size with respect to all of the first unit filters (F1, F1', and F1"). Each first lower pattern film 131 may include a third dielectric 135a, and a plurality of fourth dielectrics 135b regularly arranged in the third dielectric 135a to form the second patterns. The first lower pattern films 131 may include the second patterns having the same size with respect to all of the first unit filters (F1, F1', and F1"). Each first upper pattern film 241 may include a fifth dielectric 245a, and a plurality of sixth dielectrics 245b regularly arranged in the fifth dielectric 245a to form the third patterns. The first upper pattern films 241 may include the third patterns having the same size with respect to all of the first unit filters (F1, F1', and F1").

The first unit filter F1 located at the center of the spectral filter 1600 may further include a first wavelength shift compensation layer 661 arranged between the first cavity 121 and the second metal reflection layer 128, the first unit filter F1' located at the first position may further include a second wavelength shift compensation layer 661' arranged between the first cavity 121 and the second metal reflection layer 128, and the first unit filter F1" located at the second position may further include a third wavelength shift compensation layer 661" arranged between the first cavity 121 and the second metal reflection layer 128. The first to third wavelength shift compensation layers 661, 661', and 661" may include a fourth pattern varying in size according to the position of the first unit filter (F1, F1', and F1").

Figure 17:
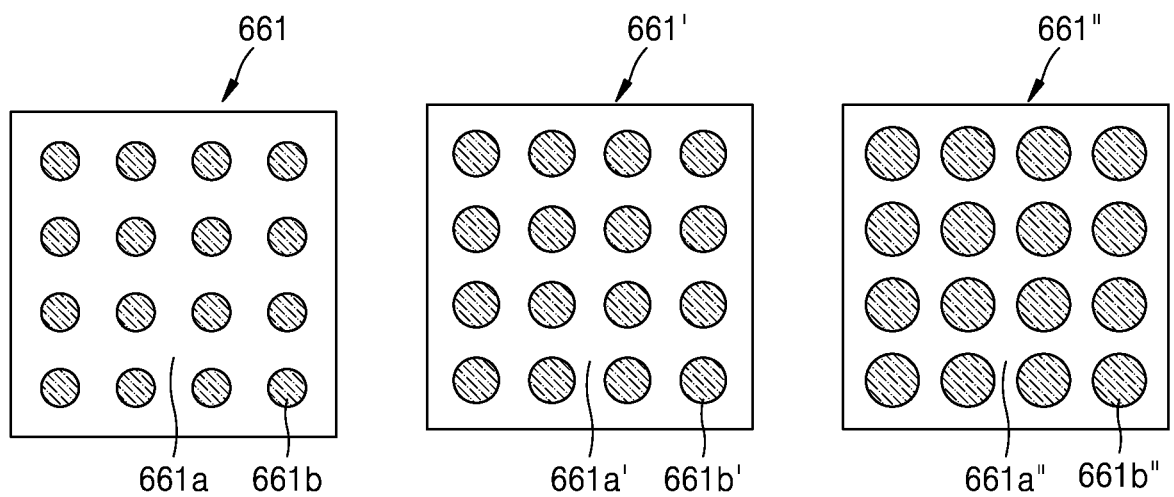
FIG. 17 is an internal plan view of a wavelength shift compensation layer of FIG. 16.

FIG. 17 is a plan view illustrating an example of the first wavelength shift compensation layer 661 of the first unit filter F1 located at the center of the spectral filter 1600, the second wavelength shift compensation layer 661' of the first unit filter F1' located at the first position, and the third wavelength shift compensation layer 661" of the first unit filter F1" located at the second position. With reference to FIG. 17, the first to third wavelength shift compensation layers 661, 661', and 661" may respectively include a seventh dielectric (661a, 661a', and 661a") and a plurality of eighth dielectrics (661b, 661b', and 661b") arranged regularly in the seventh dielectric (661a, 661a', and 661a") to form fourth patterns.

The size of the fourth patterns of the first to third wavelength shift compensation layers 661, 661', and 661" may increase as the position of the first unit filter (F1, F1', and F1") moves from the center towards an outer position of the spectral filter 1600. However, the embodiments are not limited thereto, and the size of the fourth patterns of the first to third wavelength shift compensation layers 661, 661', and 661" may decrease as the position of the first unit filter (F1, F1', and F1") moves from the center towards an outer position of the spectral filter 1600, according to a material constituting the seventh dielectric (661*a*, 661*a'*, and 661*a"*) and the eighth dielectrics (661*b*, 661*b'*, and 661*b"*). The first to third wavelength shift compensation layers 661, 661', and 661" may be further provided at the first lower pattern film 131 and/or the first upper pattern film 241.

Figure 18:
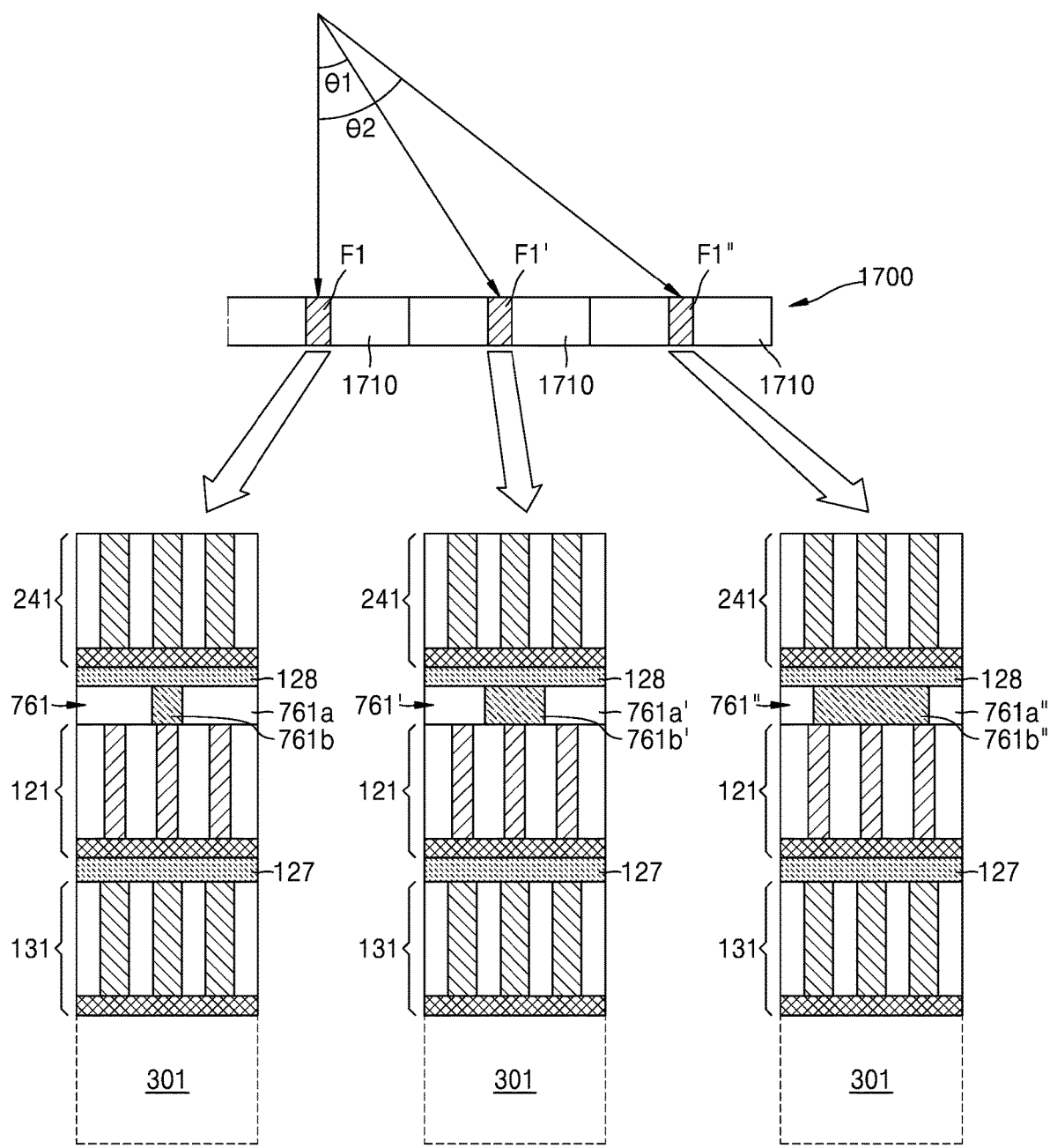
FIG. 18 is a diagram of a spectral filter according to another embodiment.

FIG. 18 is a diagram of a spectral filter 1700 according to another embodiment. The spectral filter 1700 of FIG. 18 may be identical to the spectral filter of FIG. 16 except for a first wavelength shift compensation layer 761, a second wavelength shift compensation layer 761', and a third wavelength shift compensation layer 761".

Figure 19:
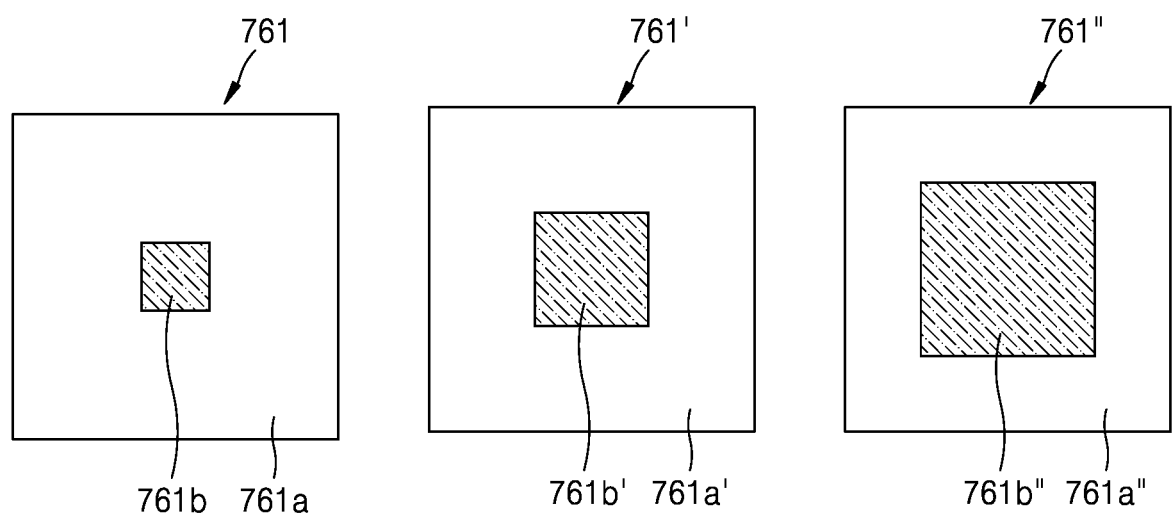
FIG. 19 is an internal plan view of a wavelength shift compensation layer of FIG. 18.

With reference to FIG. 19, the first unit filter F1 located at the center of the spectral filter 1700 may further include the first wavelength shift compensation layer 761 arranged between the first cavity 121 and the second metal reflection layer 128, the first unit filter F1' located at the first position may further include the second wavelength shift compensation layer 761' arranged between the first cavity 121 and the second metal reflection layer 128, and the first unit filter F1" located at the second position may further include the third wavelength shift compensation layer 761" arranged between the first cavity 121 and the second metal reflection layer 128. The first to third wavelength shift compensation layers 761, 761', and 761" may include a fourth pattern varying in size according to the position of the first unit filter (F1, F1', and F1").

FIG. 19 is a plan view illustrating an example of the first wavelength shift compensation layer 761 of the first unit filter F1 located at the center of the spectral filter 1700, the second wavelength shift compensation layer 761' of the first unit filter F1' located at the first position, and the third wavelength shift compensation layer 761" of the first unit filter F1" located at the second position. With reference to FIG. 19, the first to third wavelength shift compensation layers 761, 761', and 761" may respectively include a seventh dielectric (761*a*, 761*a'*, and 761*a"*) and a plurality of eighth dielectrics (761*b*, 761*b'*, and 761*b"*) arranged in the seventh dielectric (761*a*, 761*a'*, and 761*a"*) to form fourth patterns.

The size of the fourth patterns of the first to third wavelength shift compensation layers 761, 761', and 761" may increase as the position of the first unit filter (F1, F1', and F1") moves from the center towards an outer position of the spectral filter 1700. However, the embodiments are not limited thereto.

Figure 20:
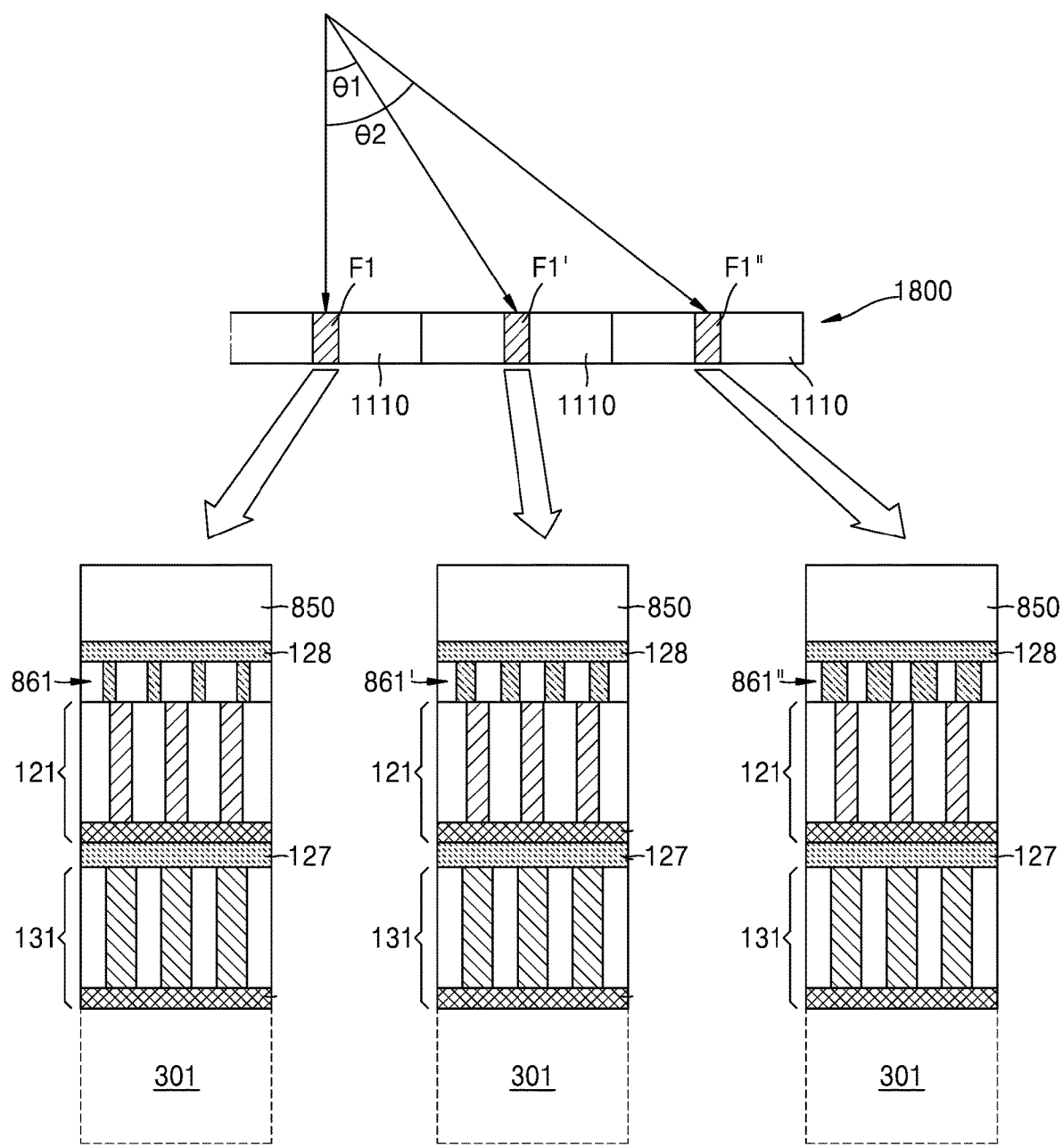
FIG. 20 is a diagram of a spectral filter according to another embodiment.

FIG. 20 is a diagram of a spectral filter 1800 according to another embodiment. The spectral filter 1800 of FIG. 20 may be identical to the spectral filter 1600 of FIG. 16 except that instead of the upper pattern film, a color filter 850 is provided on a first shift compensation layer 861, a second shift compensation layer 861', and a third shift compensation layer 861".

The drawings illustrate a case where the first to third shift compensation layers 861, 861', and 861" are respectively the first to third wavelength shift compensation layers 661, 661', and 661". However, the embodiments are not limited thereto, and in the first cavity 121, the first and second wavelength shift compensation layers 561' and 561" illustrated in FIG. 16 may be provided or the first to third wavelength shift compensation layers 761, 761', and 761" illustrated in FIG. 18 may be provided.

A color filter 850 may be further provided at the first to third shift compensation layers 861, 861', and 861". The color filter 850 may block light having a wavelength band which is not desired by the first unit filters (F1, F1', and F1"), and may include, for example, a blue color filter, a green color filter, or a red color filter.

Figure 21:
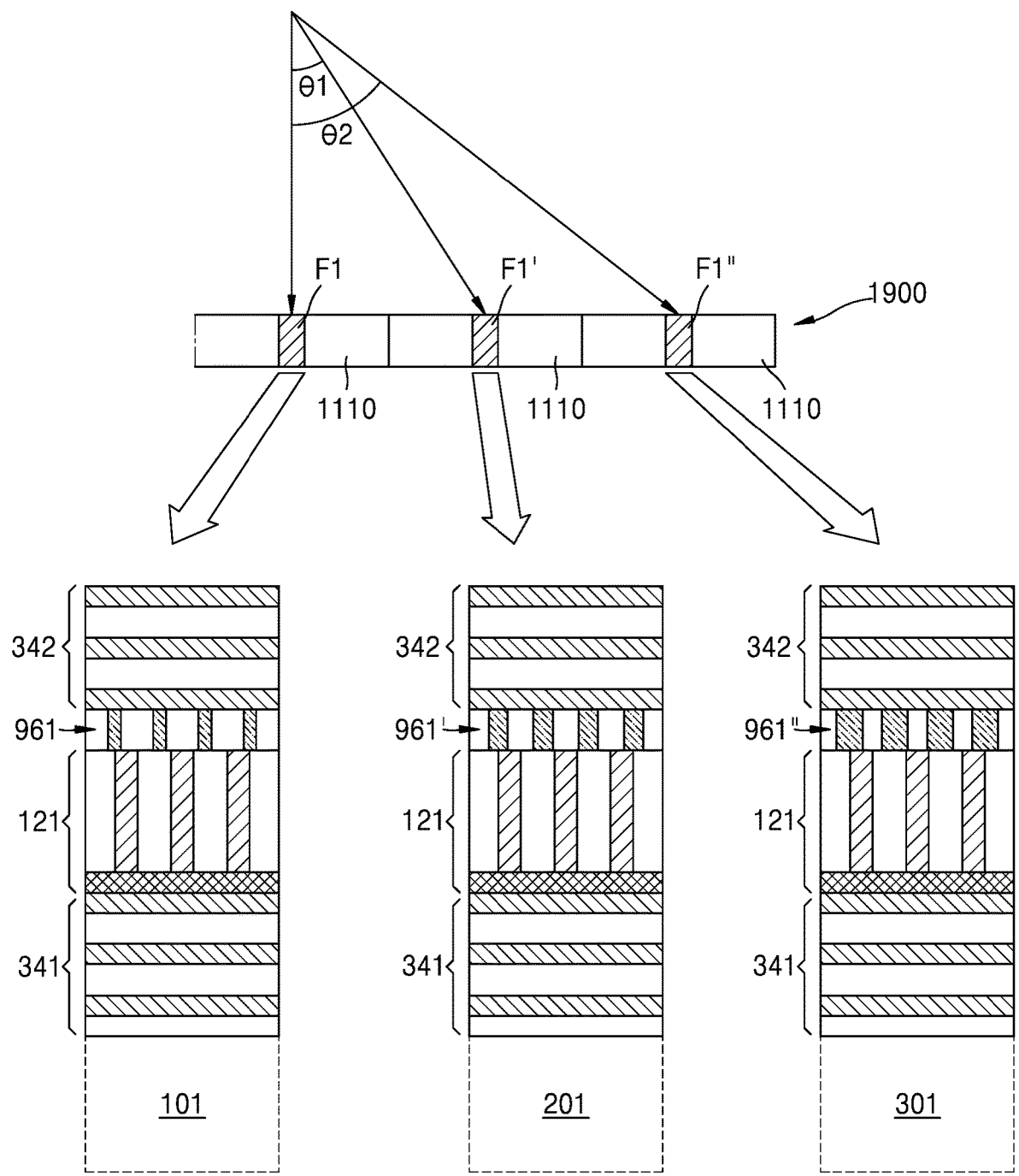
FIG. 21 is a diagram of a spectral filter according to another embodiment.

FIG. 21 is a diagram of a spectral filter 1900 according to another embodiment.

With reference to FIG. 21, each of the first unit filters (F1, F1', and F1") may include the first and second Bragg reflection layers 341 and 342 and the first cavity 121 may be arranged between the first and second Bragg reflection layers 341 and 342. The first cavities 121 may include the first patterns having the same size with respect to all of the first unit filters (F1, F1', and F1").

The first unit filter F1 located at the center of the spectral filter 1900 may further include a first wavelength shift compensation layer 961 arranged between the first cavity 121 and the second Bragg reflection layer 128, the first unit filter F1' located at the first position may further include a second wavelength shift compensation layer 961' arranged between the first cavity 121 and the second Bragg reflection layer 128, and the first unit filter F1" located at the second position may further include a third wavelength shift compensation layer 961" arranged between the first cavity 121 and the second Bragg reflection layer 128.

The first to third wavelength shift compensation layers 961, 961', and 961" may include a fourth pattern varying in size according to the position of the first unit filter (F1, F1', and F1"). The drawings illustrate a case where the first to third shift compensation layers 961, 961', and 961" are respectively the first to third wavelength shift compensation layers 661, 661', and 661". However, the embodiments are not limited thereto, and in the first cavity 121, the first and second wavelength shift compensation layers 561' and 561" illustrated in FIG. 16 may be provided or the first to third wavelength shift compensation layers 761, 761', and 761" illustrated in FIG. 18 may be provided.

Figure 22:
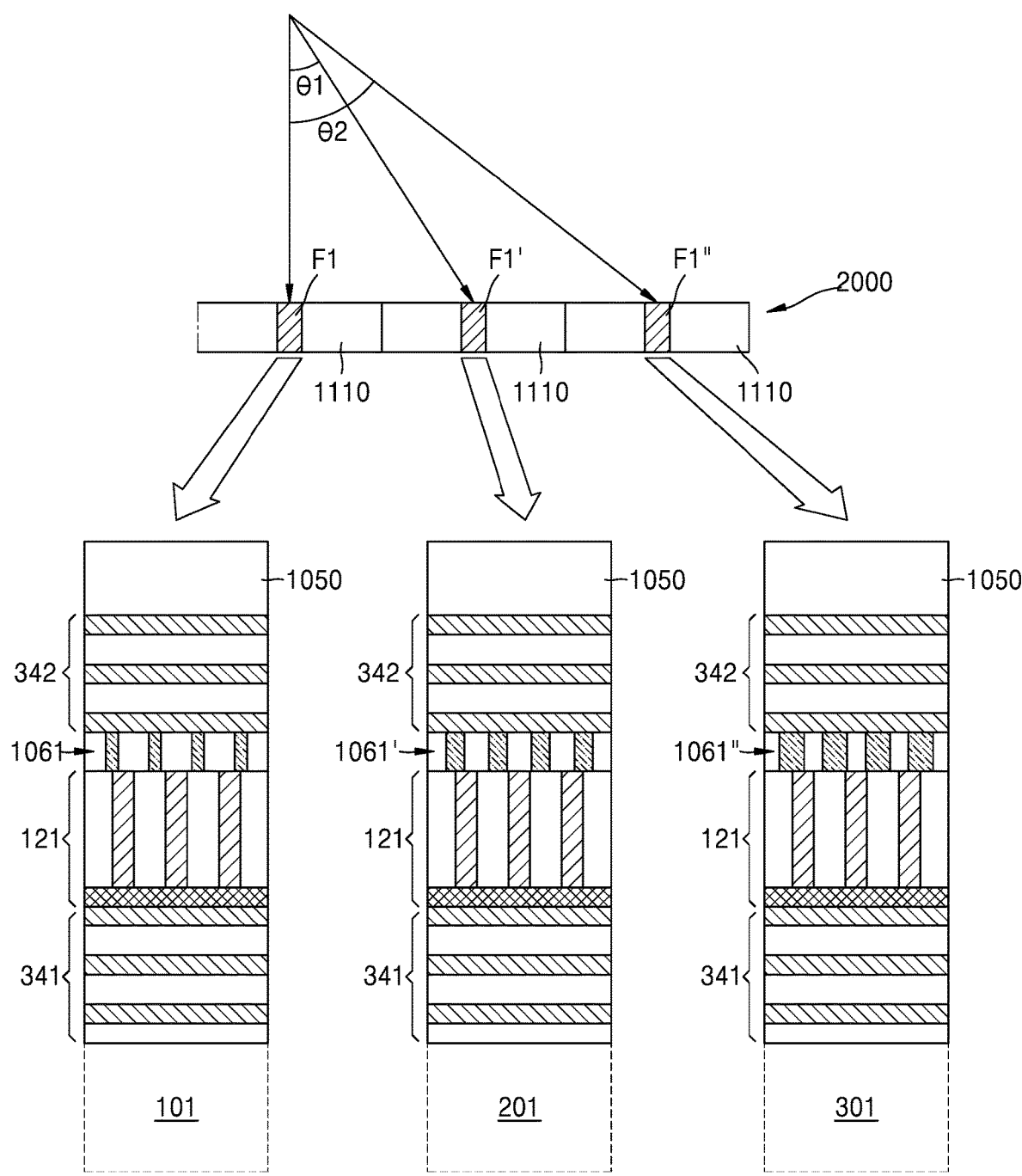
FIG. 22 is a diagram of a spectral filter according to another embodiment.

FIG. 22 is a diagram of a spectral filter 2000 according to another embodiment. The spectral filter 2000 of FIG. 22 may be identical to the spectral filter 1900 of FIG. 21 except that the spectral filter 2000 further includes a color filter 1050.

Figure 23:
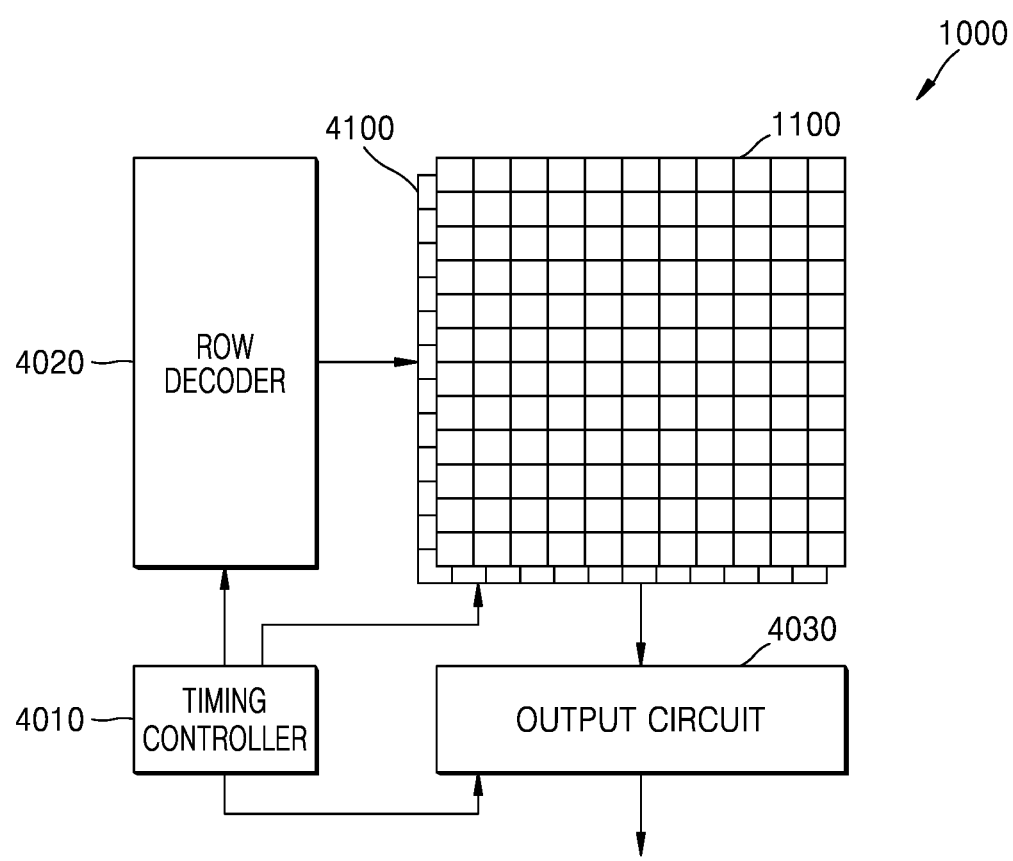
FIG. 23 is a block diagram of an image sensor according to an embodiment.

With reference to FIG. 22, the color filter 1050 may be provided on the second Bragg reflection layer 342. The color filter 1050 may block light having a wavelength band which is not desired by the first unit filters (F1, F1', and F1"), and the color filter 450 may include, for example, a blue color filter, a green color filter, or a red color filter. FIG. 23 is a schematic block diagram of an image sensor according to an embodiment.

Referring to FIG. 23, the image sensor 1000 may include a spectral filter 1100, a pixel array 4100, a timing controller 4010, a row decoder 4020, and an output circuit 4030. The image sensor 1000 may include a charge coupled device (CCD) image sensor or a complementary metal oxide semiconductor (CMOS) image sensor, but the embodiments are not limited thereto.

The spectral filter 1100 may include a plurality of unit filters that transmit light of different wavelength ranges and are arranged in two dimensions. The pixel array 4100 may include a plurality of pixels that detect light of different wavelengths that transmitted through the unit filters. In detail, the pixel array 4100 may include pixels arranged in two dimensions along a plurality of rows and columns. The row decoder 4020 may select one of the rows of the pixel array 4100 in response to a row address signal output from the timing controller 4010. The output circuit 4030 may output a light detection signal in units of columns from the pixels arranged in a selected row. To this end, the output circuit 4030 may include a column decoder and an analog to digital converter (ADC). For example, the output circuit 4030 may include a plurality of ADCs arranged for each column between the column decoder and the pixel array 4100, or a single ADC arranged at an output end of the column decoder. The timing controller 4010, the row decoder 4020, and the output circuit 4030 may be implemented by a single chip or separate chips. A processor for processing an image signal output through the output circuit 4030 may be implemented by a single chip with the timing controller 4010, the row decoder 4020, and the output circuit 4030. The pixel array 4100 may include a plurality of pixels that detect light of different wavelengths, and the pixels may be arranged in various methods.

The image sensor 1000 including the above-described spectral filter (1100 to 2000) may be employed in various high performance optical devices or high performance electronic devices. The electronic devices may include, for example, smart phones, mobile phones, cellular phones, personal digital assistants (PDAs), laptop computers, personal computers (PCs), various portable devices, home appliances, security cameras, medical cameras, automobiles, Internet of Things (IOT) devices, and other mobile or non-mobile computing devises, but the embodiments are not limited thereto.

The electronic devices may further include, in addition to the image sensor 1000, a processor for controlling an image sensor, for example, an application processor (AP), control a number of hardware or software constituent elements by driving operating systems or application programs through the processor, and perform various data processing and calculations. The processors may further include graphics processing units (GPUs) and/or image signal processors. When the processors include image signal processors, an image (or video) obtained through an image sensor may be stored and/or output using the processor.

Figure 24:
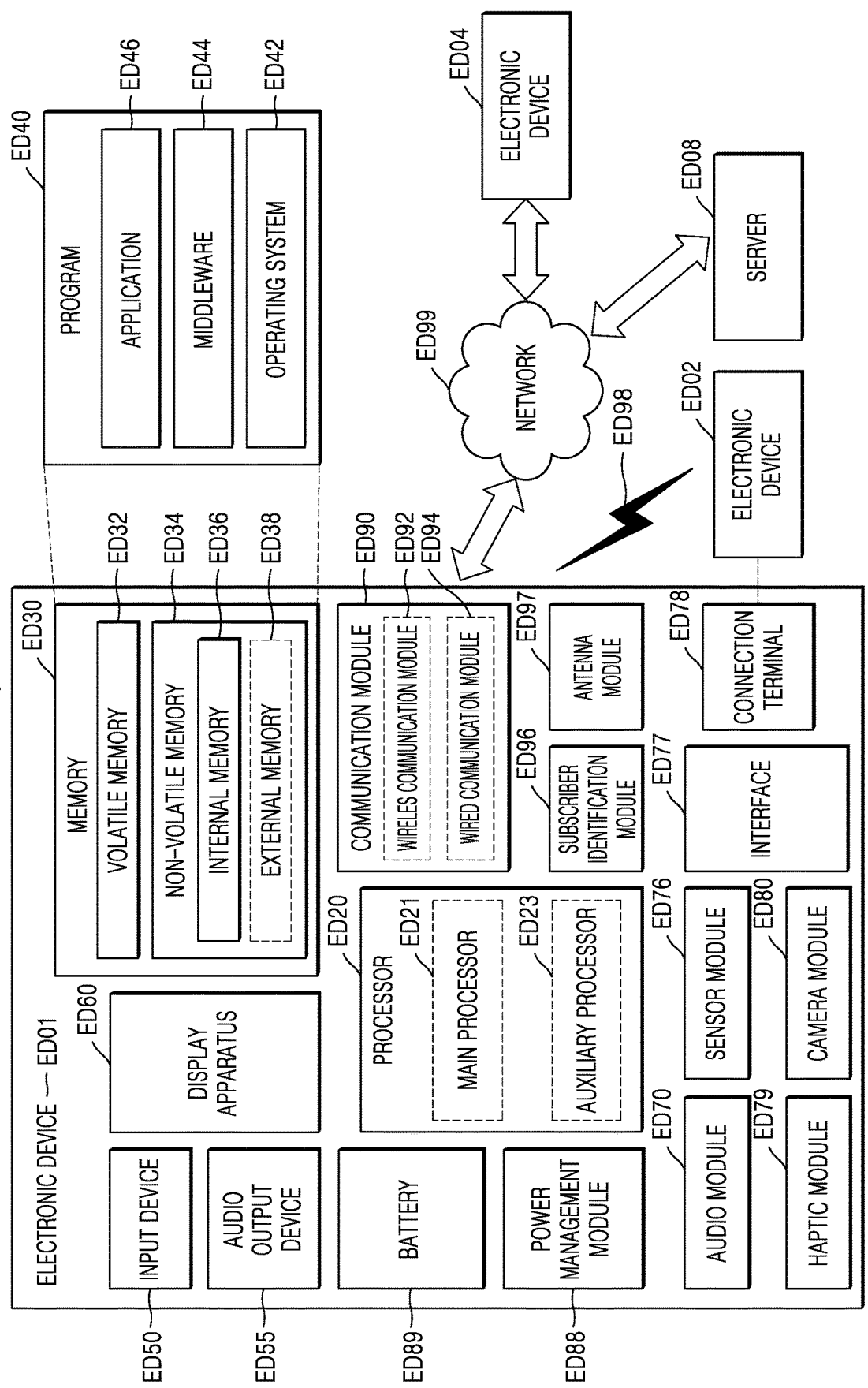
FIG. 24 is a schematic block diagram of an electronic device including an image sensor, according to embodiments.

FIG. 24 is a block diagram of an electronic device ED01 including the image sensor 1000. With reference to FIG. 24, in a network environment ED00, the electronic device ED01 may communicate with another electronic device ED02 through a first network ED98 (e.g., short-range wireless communication network), or communicate with another electronic device ED04 and/or a server ED08 through a second network ED99 (e.g., long-range wireless communication network) The electronic device ED01 may communicate with the electronic device ED04 through the server ED08. The electronic device ED01 may include a processor ED20, a memory ED30, an input device ED50, an audio output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic device ED01, some (e.g., the display device ED60) of constituent elements may be omitted or other constituent elements may be added. Some of the constituent elements may be implemented by one integrated circuit. For example, the sensor module ED76 (a fingerprint sensor, an iris sensor, and/or an illuminance sensor) may be implemented by being embedded in the display device ED60 (e.g., a display). Furthermore, when the image sensor 1000 includes a spectral function, some functions (e.g., that of a color sensor and an illuminance sensor) of the sensor module ED76 may be implemented by the image sensor 1000, not by a separate sensor module.

The processor ED20 may control one or a plurality of other constituent elements (e.g., hardware and software constituent elements) of the electronic device ED01 connected to the processor ED20 by executing software (e.g., a program ED40), and perform various data processing or calculations. As part of the data processing or calculations, the processor ED20 may load, in a volatile memory ED32, commands and/or data received from other constituent elements (e.g., the sensor module ED76 and/or the communication module ED90), process the command and/or data stored in the volatile memory ED32, and store result data in a non-volatile memory ED34. The processor ED20 may include a main processor ED21 (e.g., a central processing unit, an application processor) and an auxiliary processor ED23 (e.g., a graphics processing unit, an image signal processor, a sensor hub processor, and/or a communication processor) that is operable independently of or together with the main processor ED21. The auxiliary processor ED23 may use less power than the main processor ED21 and may perform a specialized function.

Instead of the main processor ED21 (e.g., when the main processor ED21 is in an inactive state (sleep state), or when the main processor ED21 is in an active state (application execution state)), the auxiliary processor ED23 may control functions and/or states related to some constituent elements (e.g., the display device ED60, the sensor module ED76, and/or the communication module ED90) of the constituent elements of the electronic device ED01. The auxiliary processor ED23 (e.g., an image signal processor and/or a communication processor) may be implemented as a part of functionally related other constituent elements (e.g., the camera module ED80 and/or the communication module ED90).

The memory ED30 may store various data needed by the constituent elements (e.g., the processor ED20 and/or the sensor module ED76) of the electronic device ED01. The data may include, for example, software (e.g., the program ED40) and input data and/or output data about commands related thereto. The memory ED30 may include the volatile memory ED32 and/or the non-volatile memory ED34. The non-volatile memory ED34 may include an internal memory ED36 fixedly installed in the electronic device ED01 and an external memory ED38 that is removable.

The program ED40 may be stored in the memory ED30 as software, and may include an operating system ED42, middleware ED44, and/or an application ED46.

The input device ED50 may receive commands and/or data to be used for constituent elements (e.g., the processor ED20) of the electronic device ED01, from the outside (e.g., from a user) of the electronic device ED01. The input device ED50 may include a microphone, a mouse, a keyboard, and/or a digital pen (e.g., a stylus pen).

The audio output device ED55 may output an audio signal to the outside of the electronic device ED01. The audio output device ED55 may include a speaker and/or a receiver. The speaker may be used for general purposes such as multimedia playback or recording playback, and the receiver can be used to receive incoming calls. The receiver may be implemented by being coupled as a part of the speaker or by an independent separate device.

The display device ED60 may visually provide information to the outside of the electronic device ED01. The display device ED60 may include a display, a hologram device, or a projector, and a control circuit to control a corresponding device. The display device ED60 may include a touch circuitry set to detect a touch and/or a sensor circuit (e.g., a pressure sensor) set to measure the strength of a force generated by the touch.

The audio module ED70 may convert sound into electrical signals or reversely electrical signals into sound. The audio module ED70 may obtain sound through the input device ED50, or output sound through a speaker and/or a headphone of another electronic device (e.g., the electronic device ED02) connected to the audio output device ED55 and/or the electronic device ED01 in a wired or wireless manner.

The sensor module ED76 may detect an operation state (e.g., power and/or temperature) of the electronic device ED01, or an external environment state (e.g., a user state), and generate an electrical signal and/or a data value corresponding to a detected state. The sensor module ED76 may include a gesture sensor, a gyro sensor, a barometric pressure sensor, a magnetic sensor, an acceleration sensor, a grip sensor, a proximity sensor, a color sensor, an IR sensor, a biometric sensor, a temperature sensor, a humidity sensor, and/or an illuminance sensor.

The interface ED77 may support one or a plurality of specified protocols used for the electronic device ED01 to be connected to another electronic device (e.g., the electronic device ED02 in a wired or wireless manner. The interface ED77 may include a high definition multimedia interface (HDMI), a universal serial bus (USB) interface, an SD card interface, and/or an audio interface.

A connection terminal ED78 may include a connector for the electronic device ED01 to be physically connected to another electronic device (e.g., the electronic device ED02). The connection terminal ED78 may include an HDMI connector, a USB connector, an SD card connector, and/or an audio connector (e.g., a headphone connector).

The haptic module ED79 may convert electrical signals into mechanical stimuli (e.g., vibrations and/or movements) or electrical stimuli that are perceivable by a user through tactile or motor sensations. The haptic module ED79 may include a motor, a piezoelectric device, and/or an electrical stimulation device.

The camera module ED80 may be configured to capture a still image and/or a video. The camera module ED80 may include a lens assembly including one or a plurality of lenses, the image sensor 1000 of FIG. 1, image signal processors, and/or flashes. The lens assembly included in the camera module ED80 may collect light emitted from a subject for image capturing.

The power management module ED88 may manage power supplied to the electronic device ED01. The power management module ED88 may be implemented as a part of a power management integrated circuit (PMIC).

The battery ED89 may supply power to the constituent elements of the electronic device ED01. The battery ED89 may include non-rechargeable primary cells, rechargeable secondary cells, and/or fuel cells.

The communication module ED90 may establish a wired communication channel and/or a wireless communication channel between the electronic device ED01 and another electronic device (e.g., the electronic device ED02, the electronic device ED04, and/or the server ED08), and support a communication through an established communication channel. The communication module ED90 may be operated independent of the processor ED20 (e.g., the application processor), and may include one or a plurality of communication processors supporting a wired communication and/or a wireless communication. The communication module ED90 may include a wireless communication module ED92 (e.g., a cellular communication module, a short-range wireless communication module, and/or a global navigation satellite system (GNSS) communication module), and/or a wired communication module ED94 (e.g., a local area network (LAN) communication module, and/or a power line communication module). Among the above communication modules, a corresponding communication module may communicate with another electronic device through the first network ED98 (e.g., a short-range communication network such as Bluetooth, WiFi Direct, or infrared data association (IrDA)) or the second network ED99 (e.g., a long-range communication network such as a cellular network, the Internet, and/or a computer network (e.g., LAN, WAN)). These various types of communication modules may be integrated into one constituent element (e.g., a single chip), or may be implemented as a plurality of separate constituent elements (e.g., multiple chips). The wireless communication module ED92 may verify and authenticate the electronic device ED01 in a communication network such as the first network ED98 and/or the second network ED99 by using subscriber information (e.g., an international mobile subscriber identifier (IMSI)) stored in the subscriber identification module ED96.

The antenna module ED97 may transmit signals and/or power to the outside (e.g., another electronic device) or receive signals and/or power from the outside. An antenna may include an emitter formed in a conductive pattern on a substrate (e.g., a printed circuit board (PCB)). The antenna module ED97 may include one or a plurality of antennas. When the antenna module ED97 includes a plurality of antennas, the communication module ED90 may select, from among the antennas, an appropriate antenna for a communication method used in a communication network such as the first network ED98 and/or the second network ED99. Signals and/or power may be transmitted or received between the communication module ED90 and another electronic device through the selected antenna. Other parts (e.g., an RFIC) than the antenna may be included as a part of the antenna module ED97.

Some of the constituent elements may be connected to each other through a communication method between peripheral devices (e.g., a bus, general purpose input and output (GPIO), a serial peripheral interface (SPI), and/or a mobile industry processor interface (MIPI)) and may mutually exchange signals (e.g., commands and/or data).

The command or data may be transmitted or received between the electronic device ED01 and the external electronic device ED04 through the server ED08 connected to the second network ED99. The electronic devices ED02 and ED04 may be of a type that is the same as or different from the electronic device ED01. All or a part of operations executed in the electronic device ED01 may be executed in one or a plurality of the electronic devices (ED02, ED04, and ED08). For example, when the electronic device ED01 is set to perform a function or service, the electronic device ED01 may request one or a plurality of electronic devices to perform part of the whole of the function or service, instead of itself performing the entirety of the function or service. The one or a plurality of the electronic devices receiving the request may perform additional function or service related to the request, and transmit a result of the performance to the electronic device ED01. To this end, cloud computing, distributed computing, and/or client-server computing technology may be used.

Figure 25:
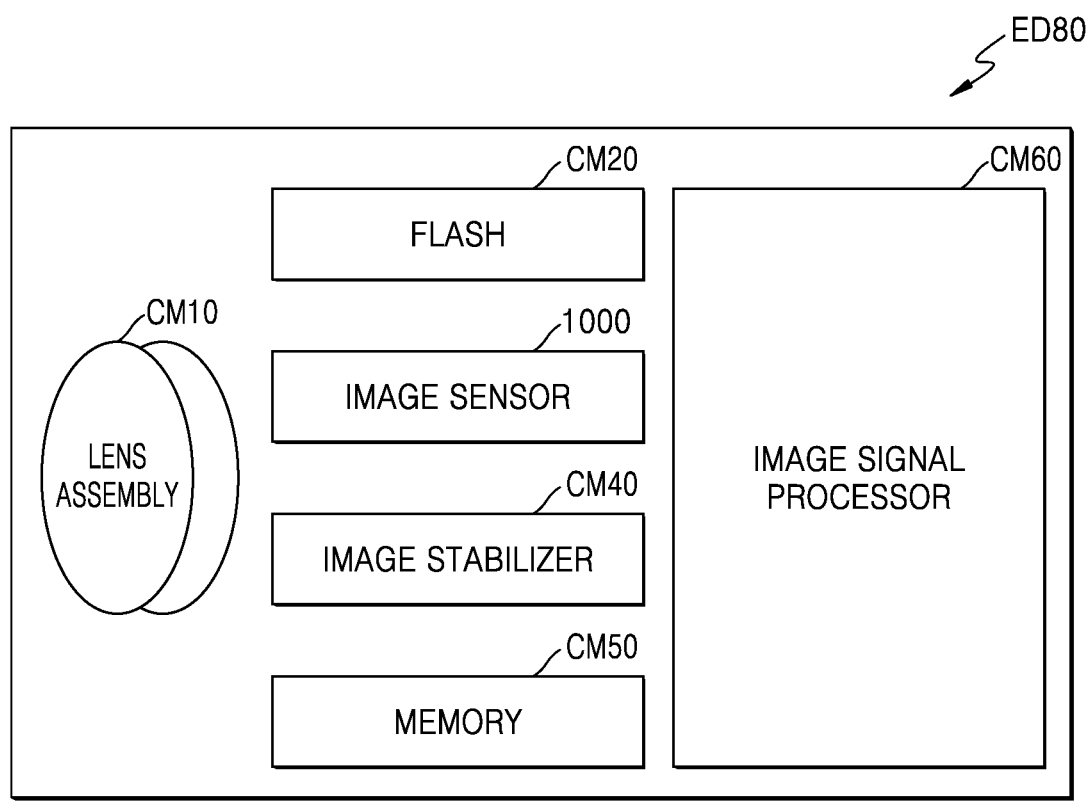
FIG. 25 is a schematic block diagram of a camera module of FIG. 24.

FIG. 25 is a block diagram of the camera module ED80 of FIG. 24. Referring to FIG. 25, the camera module ED80 may include a lens assembly CM10, a flash CM20, the image sensor 1000 (e.g., the image sensor 1000 of FIG. 1), an image stabilizer CM40, a memory CM50 (e.g., a buffer memory), and/or an image signal processor CM60. The lens assembly CM10 may collect light emitted from a subject for image capturing. The camera module ED80 may include a plurality of lens assemblies CM10, and in this case, the camera module ED80 may include a dual camera, a 360 degrees camera, or a spherical camera. Some of the lens assemblies CM10 may have the same lens attributes (e.g., a viewing angle, a focal length, auto focus, F Number, and/or optical zoom), or different lens attributes. The lens assembly CM10 may include a wide angle lens or a telescopic lens.

The flash CM20 may emit light used to reinforce light emitted or reflected from a subject. The flash CM20 may include one or a plurality of light-emitting diodes (e.g., a red-green-blue (RGB) LED, a white LED, an infrared LED, and/or an ultraviolet LED), and/or a xenon lamp. The image sensor 1000 may include the image sensor of FIG. 1, and convert light emitted or reflected from the subject and transmitted through the lens assembly CM10 into electrical signals, thereby obtaining an image corresponding to the subject. The image sensor 1000 may include one or a plurality of sensors selected from image sensors having different attributes such as an RGB sensor, a black and white (BW) sensor, an IR sensor, or UV sensor. Each sensor included in the image sensor 1000 may be implemented by a charged coupled device (CCD) sensor and/or a complementary metal oxide semiconductor (CMOS) sensor.

The image stabilizer CM40 may move, in response to a movement of the camera module ED80 or an electronic device ED01 including the same, one or a plurality of lenses included in the lens assembly CM10 or the image sensor 1000 in a particular direction or may compensate a negative effect due to the movement by controlling (e.g., by adjusting a read-out timing) the movement characteristics of the image sensor 1000. The image stabilizer CM40 may detect a movement of the camera module ED80 or the electronic device ED01 by using a gyro sensor (not shown) or an acceleration sensor (not shown) arranged inside or outside the camera module ED80. The image stabilizer CM40 may be implemented in an optical form.

The memory CM50 may store a part or entire data of an image obtained through the image sensor 1000 for a subsequent image processing operation. For example, when a plurality of images are obtained at high speed, only low resolution images are displayed while the obtained original data (e.g., Bayer-Patterned data and/or high resolution data) is stored in the memory CM50. The memory CM50 may be used to transmit the original data of a selected (e.g., user selected) image to the image signal processor CM60. The memory CM50 may be incorporated into the memory ED30 of the electronic device ED01, or configured to be an independently operated separate memory.

The image signal processor CM60 may perform image processing on the image obtained through the image sensor 1000 or the image data stored in the memory CM50. The image processing may include depth map generation, three-dimensional modeling, panorama generation, feature point extraction, image synthesis, and/or image compensation (e.g., noise reduction, resolution adjustment, brightness adjustment, blurring, sharpening, and/or softening). The image signal processor CM60 may perform control (e.g., exposure time control and/or read-out timing control) on constituent elements (e.g., the image sensor 1000) included in the camera module ED80. The image processed by the image signal processor CM60 may be stored again in the memory CM50 for additional processing or provided to external constituent elements (e.g., the memory ED30, the display device ED60, the electronic device ED02, the electronic device ED04, and/or the server ED08) of the camera module ED80. The image signal processor CM60 may be incorporated into the processor ED20, or configured to be a separate processor operated independently of the processor ED20. When the image signal processor CM60 is configured by a separate processor from the processor ED20, the image processed by the image signal processor CM60 may undergo additional image processing by the processor ED20 and then displayed through the display device ED60.

The electronic device ED01 may include a plurality of camera modules ED80 having different attributes or functions. In this case, one of the camera modules ED80 may be a wide angle camera, and another may be a telescopic camera. Similarly, one of the camera modules ED80 may be a front side camera, and another may be a read side camera.

Figure 26:
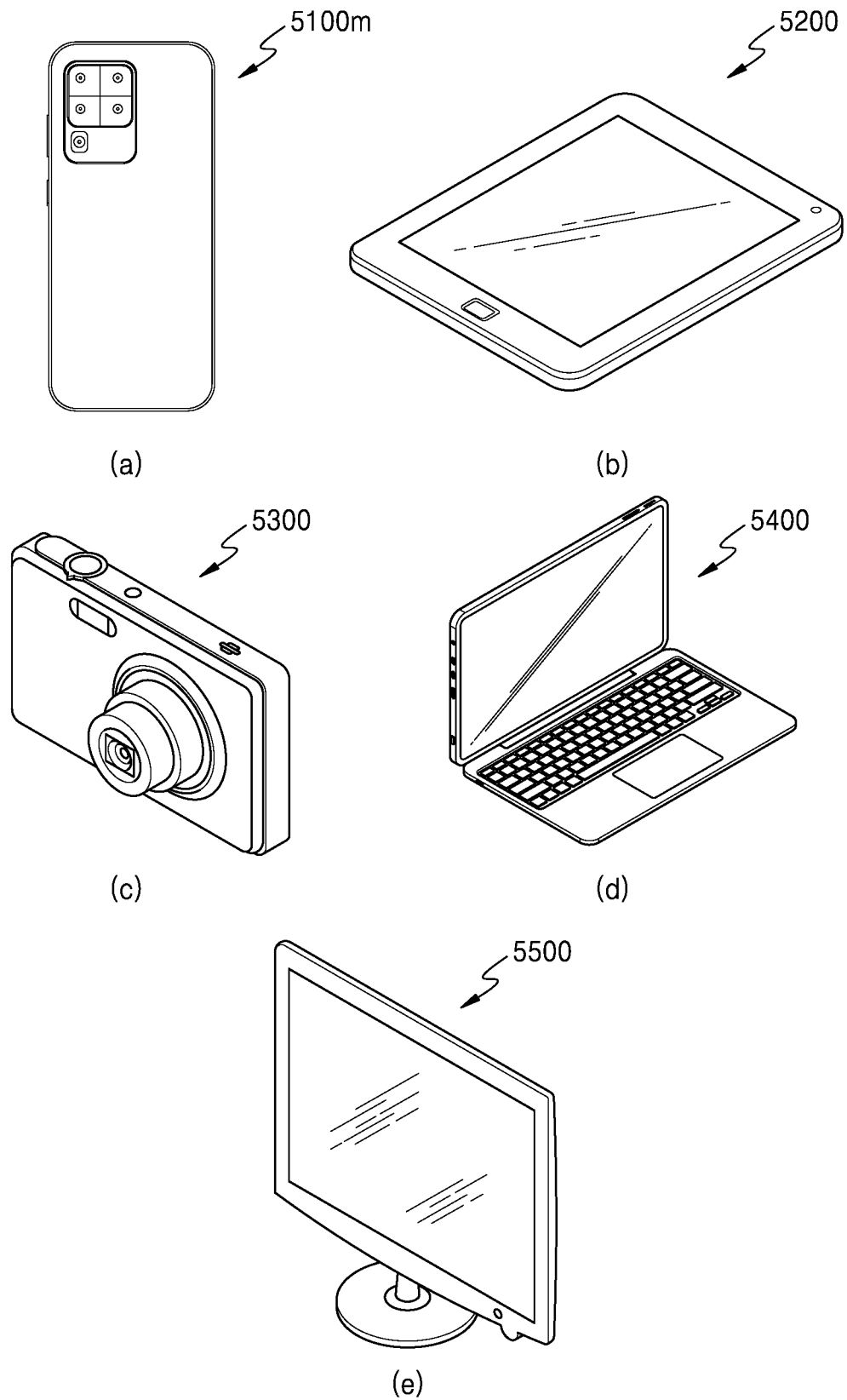
FIGS. 26 and 27 are diagrams of various examples of an electronic device to which image sensors according to embodiments are applied.

The image sensor 1000 according to embodiments may be applied to a mobile phone or smartphone 5100*m* illustrated in (a) of FIG. 26, a tablet or smart tablet 5200 illustrated in (b) of FIG. 26, a digital camera or camcorder 5300 illustrated in (c) of FIG. 26, a notebook computer 5400 illustrated in (d) of FIG. 26, and/or a television or smart television 5500 illustrated in (e) of FIG. 26. For example, the smartphone 5100*m* or the smart tablet 5200 may include a plurality of high resolution cameras, each having a high resolution image sensor mounted thereon. Depth information of subjects in an image may be extracted by using a high resolution cameras, out focusing of the image may be adjusted, or subjects in the image may be automatically identified.

Figure 27:
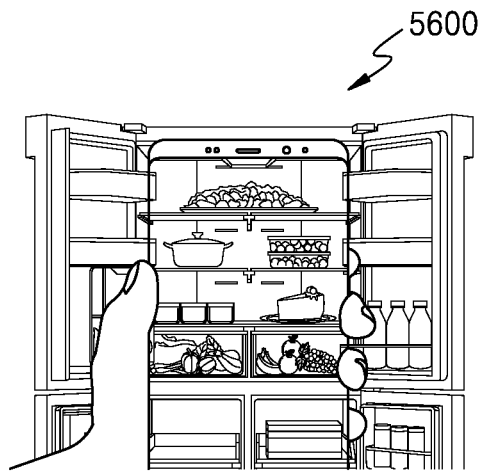
Figure 27:
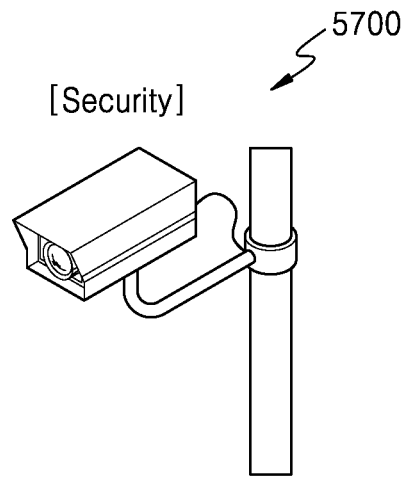
Figure 27:
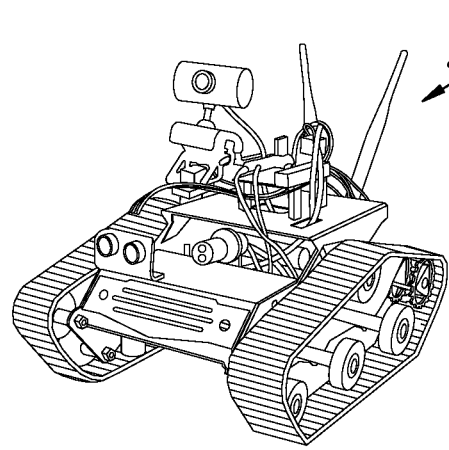
Figure 27:
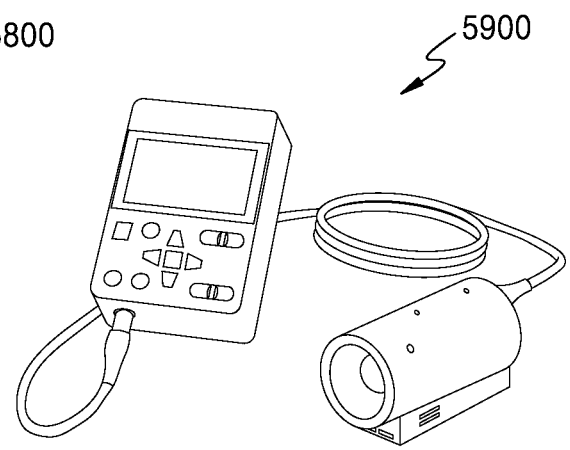
Figure 27:
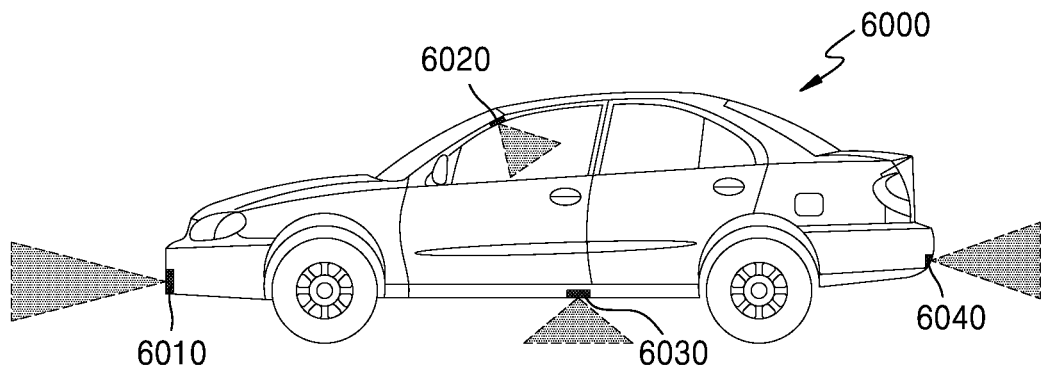

Furthermore, the image sensor 1000 may be applied to a smart refrigerator 5600 illustrated in (a) of FIG. 27, a security camera 5700 illustrated in (b) of FIG. 27, a robot 5800 illustrated in (c) of FIG. 27, and/or a medical camera 5900 illustrated in (d) of FIG. 27. For example, the smart refrigerator 5600 may automatically recognize food in a refrigerator, by using an image sensor, and notify a user of the presence of a particular food, the type of food that is input or output, and the like, through a smartphone. The security camera 5700 may provide an ultrahigh resolution image and may recognize an object or a person in an image in a dark environment by using high sensitivity. The robot 5800 may be provided in a disaster or industrial site that is not directly accessible by people, and may provide a high resolution image. The medical camera 5900 may provide a high resolution image for diagnosis or surgery, and thus a field of vision may be dynamically adjusted.

Furthermore, the image sensor 1000 may be applied to a vehicle 6000 as illustrated in (e) of FIG. 27. The vehicle 6000 may include a plurality of vehicle cameras 6010, 6020, 6030, and 6040 arranged at various positions. Each of the vehicle cameras 6010, 6020, 6030, and 6040 may include an image sensor according to an embodiment. The vehicle 6000 may provide a driver with various pieces of information about the inside or periphery of the vehicle 6000, by using the vehicle cameras 6010, 6020, 6030, and 6040, and thus an object or a person in an image may be automatically recognized and information needed for autonomous driving is provided.

The spectral filter according to an embodiment, as the unit filters having the same center wavelength include components having a varying effective refractive index according position (e.g., a cavity, a lower pattern film, an upper pattern film, or a wavelength shift compensation layer), the center wavelength shift caused by a change of a chief ray angle of incident light may be compensated.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A spectral filter comprising a plurality of filter arrays each including a plurality of unit filters having different center wavelengths from each other,
wherein each of the plurality of unit filters comprises:
a first metal reflection layer and a second metal reflection layer which are disposed to be apart from each other;
a cavity including a first pattern and being arranged between the first metal reflection layer and the second metal reflection layer; and
a lower pattern film being disposed under the first metal reflection layer and including a second pattern,
wherein, in unit filters having a same center wavelength in each of the plurality of unit filters corresponding to the plurality of filter arrays, the first pattern of the cavity and the second pattern of the lower pattern film vary according to a position of the unit filters having the same center wavelength to compensate for a center wavelength shift caused by a change in a chief ray angle of incident light.

2. The spectral filter of claim 1, wherein an effective refractive index of the cavity and the lower pattern film varies with a size of the first pattern and the second pattern.

3. The spectral filter of claim 1, wherein the cavities of each of the plurality of unit filters are of uniform thickness and the lower pattern films of each of the plurality of unit filters are of uniform thickness.

4. The spectral filter of claim 1, wherein each of the first metal reflection layer and the second metal reflection layer includes at least one of Al, Ag, Au, Cu, W, Ti, or TiN.

5. The spectral filter of claim 1, wherein each of the unit filters further comprises an upper pattern film being disposed on the second metal reflection layer and including a third pattern.

6. The spectral filter of claim 5, wherein, in the unit filters having the same center wavelength, the third pattern of the upper pattern film varies according to a position of the unit filters having the same center wavelength.

7. The spectral filter of claim 1, wherein each of the plurality of unit filters further comprises a color filter disposed on the second metal reflection layer and being configured to transmit only a particular wavelength band.

8. A spectral filter comprising a plurality of filter arrays each including a plurality of unit filters having different center wavelengths from each other,
wherein each of the plurality of unit filters comprises:
a first reflection layer and a second reflection layer which are disposed to be apart from each other; and
a cavity being arranged between the first reflection layer and the second reflection layer and including a first pattern,
wherein unit filters having a same center wavelength in some of the plurality of unit filters include a wavelength shift compensation layer configured to compensate for a center wavelength shift caused due to different positions of the unit filters having the same center wavelength.

9. The spectral filter of claim 8, wherein the wavelength shift compensation layer has different thicknesses according to a position of the unit filters having the same center wavelength.

10. The spectral filter of claim 8, wherein the wavelength shift compensation layer includes a pattern that varies according to a position of the unit filters having the same center wavelength.

11. The spectral filter of claim 8, wherein the first reflection layer and the second reflection layer respectively comprise a first metal reflection layer and a second metal reflection layer.

12. The spectral filter of claim 11, wherein a lower pattern film including a second pattern is disposed under the first metal reflection layer.

13. The spectral filter of claim 12, wherein the lower pattern film further includes a lower wavelength shift compensation layer.

14. The spectral filter of claim 11, wherein an upper pattern film including a third pattern is disposed on the second metal reflection layer.

15. The spectral filter of claim 14, wherein the upper pattern film further includes an upper wavelength shift compensation layer.

16. An image sensor comprising:
a pixel array including a plurality of pixels; and
a spectral filter disposed at the pixel array,
wherein the spectral filter includes a plurality of filter arrays each including a plurality of unit filters having different center wavelengths from each other,
wherein each of the plurality of unit filters comprises:
a first metal reflection layer and a second metal reflection layer which are disposed to be apart from each other;
a cavity including a first pattern and being arranged between the first metal reflection layer and the second metal reflection layer; and
a lower pattern film being disposed under the first metal reflection layer and including a second pattern,
wherein, in unit filters having a same center wavelength in each of the plurality of unit filters corresponding to the plurality of filter arrays, the first pattern of the cavity and the second pattern of the lower pattern film vary according to a position of the unit filters having the same center wavelength to compensate for a center wavelength shift caused due to different positions of the unit filters having the same center wavelength.

17. The image sensor of claim 16, wherein each of the unit filters further comprises an upper pattern film being disposed on the second metal reflection layer and including a third pattern.

18. The image sensor of claim 17, wherein, in the unit filters having the same center wavelength, the third pattern of the upper pattern film varies according to a position of the unit filters having the same center wavelength.

19. The image sensor of claim 16, wherein each of the plurality of unit filters further comprises a color filter disposed on the second metal reflection layer and being configured to transmit only a particular wavelength band.

20. The image sensor of claim 16, further comprising a timing controller, a row decoder, and an output circuit.

* * * * *